(12) United States Patent
Larsen et al.

(10) Patent No.: US 12,127,401 B2
(45) Date of Patent: Oct. 22, 2024

(54) METHODS OF FORMING MICROELECTRONIC DEVICES

(71) Applicant: Micron Technology, Inc., Boise, ID (US)

(72) Inventors: Christopher J. Larsen, Boise, ID (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/321,659

(22) Filed: May 22, 2023

(65) Prior Publication Data
US 2023/0301081 A1 Sep. 21, 2023

Related U.S. Application Data

(62) Division of application No. 17/249,552, filed on Mar. 4, 2021, now Pat. No. 11,665,894.

(51) Int. Cl.
| | |
|---|---|
| *H10B 41/27* | (2023.01) |
| *G11C 5/06* | (2006.01) |
| *H01L 21/768* | (2006.01) |
| *H01L 23/538* | (2006.01) |
| *H10B 43/27* | (2023.01) |

(52) U.S. Cl.
CPC .............. *H10B 41/27* (2023.02); *G11C 5/06* (2013.01); *H01L 21/76877* (2013.01); *H01L 23/5381* (2013.01); *H01L 23/5384* (2013.01); *H01L 23/5386* (2013.01); *H10B 43/27* (2023.02)

(58) Field of Classification Search
CPC .... G11C 5/06–10; H10B 43/50; H10B 41/50; H10B 41/20
See application file for complete search history.

(56) References Cited

U.S. PATENT DOCUMENTS

| | | | |
|---|---|---|---|
| 2015/0270165 A1* | 9/2015 | Hyun | H10B 43/35 257/329 |
| 2017/0256551 A1* | 9/2017 | Lee | H10B 41/40 |
| 2019/0096810 A1* | 3/2019 | Zhu | H01L 23/535 |
| 2019/0273089 A1* | 9/2019 | Yamamoto | H01L 21/76829 |
| 2020/0161326 A1 | 5/2020 | Oh et al. | |
| 2021/0272900 A1* | 9/2021 | Shin | H01L 23/5283 |
| 2021/0272977 A1* | 9/2021 | Shimizu | H10B 43/50 |
| 2021/0296232 A1 | 9/2021 | Zhang et al. | |
| 2021/0384124 A1 | 12/2021 | Wang et al. | |
| 2022/0284968 A1 | 9/2022 | Cao et al. | |

* cited by examiner

*Primary Examiner* — Evan G Clinton
(74) *Attorney, Agent, or Firm* — TraskBritt

(57) ABSTRACT

A microelectronic device comprises a stack structure comprising blocks separated from one another by dielectric slot structures. At least one of the blocks comprises two crest regions, a stadium structure interposed between the two crest regions in a first horizontal direction, and two bridge regions neighboring opposing sides of the stadium structure in a second horizontal direction. A filled trench vertically overlies and is within horizontal boundaries of the stadium structure of the at least one of the blocks. The filled trench comprises a dielectric liner material on the opposing staircase structures of the stadium structure and on inner sidewalls of the two bridge regions, and dielectric structures on and having a different material composition than the dielectric liner material. The dielectric structures are substantially confined within horizontal areas of the steps of the stadium structure. Memory devices, electronic systems, and methods of forming microelectronic devices are also described.

17 Claims, 16 Drawing Sheets

METHODS OF FORMING MICROELECTRONIC DEVICES

CROSS-REFERENCE TO RELATED APPLICATION

This application is a divisional of U.S. patent application Ser. No. 17/249,552, filed Mar. 4, 2021, now U.S. Pat. No. 11,665,894, issued May 30, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through one or more stack structures including tiers of conductive material and insulative material. Each string of memory cells may include at least one select device coupled thereto. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive material of the tiers of the stack structure(s) of the memory device and control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions for the conductive material of the tiers, upon which conductive contact structures can be positioned to provide electrical access to the conductive material. In turn, conductive routing structures can be employed to couple the conductive contact structures to the control logic devices. However, conventional staircase structure fabrication techniques can segment the conductive material of an individual tier in a manner resulting in discontinuous conductive paths through the tier that can require the use of multiple (e.g., more than one) switching devices (e.g., transistors) of at least one string driver to drive voltages completely across the tier and/or in opposing directions across the tier.

DETAILED DESCRIPTION

Figure 1A:
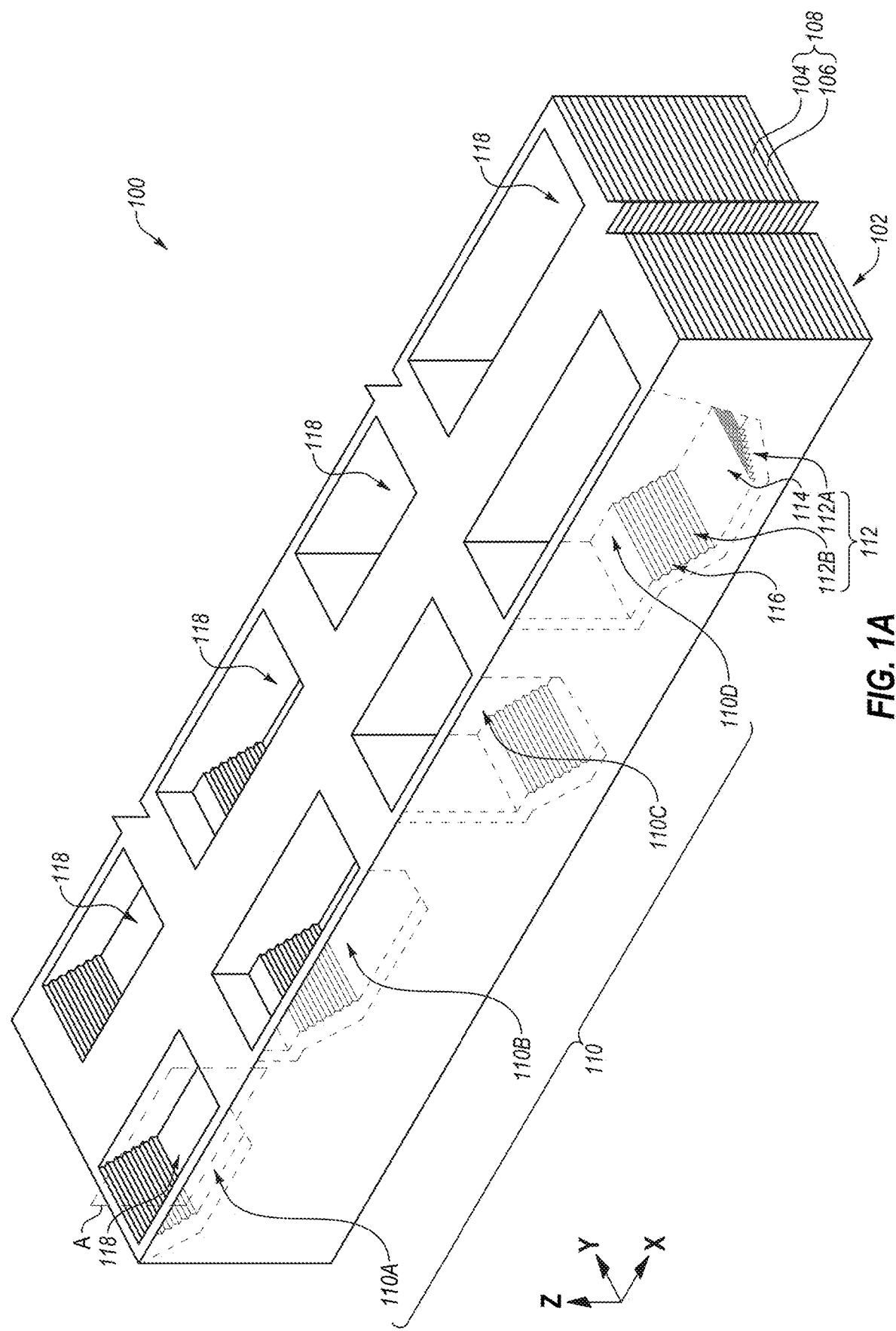
FIG. 1A is a simplified, partial perspective view of a microelectronic device structure at a processing stage of a method forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g. horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A through FIG. 6B are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 1B:
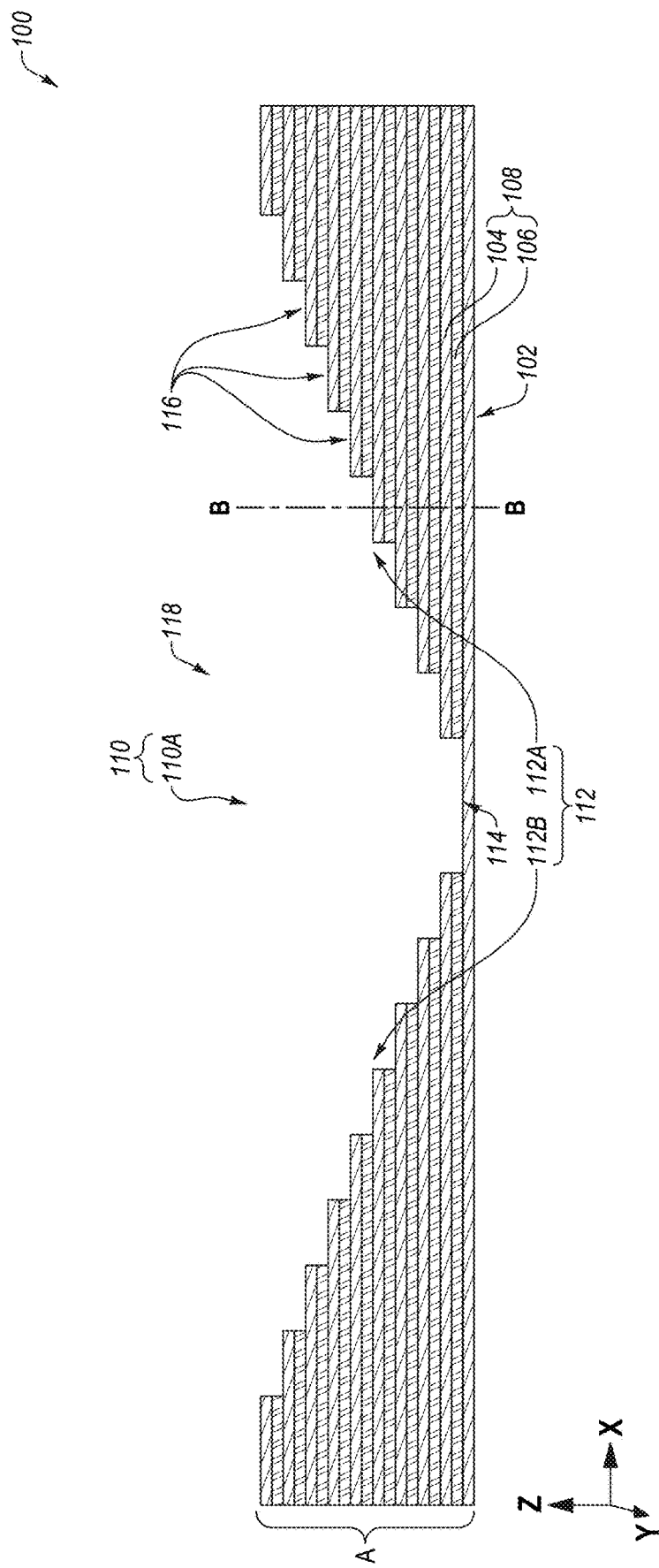
FIG. 1B is a simplified, longitudinal cross-sectional view of a portion A (identified with dashed lines in FIG. 1A) of the microelectronic device structure at the processing stage of FIG. 1A.
Figure 1C:
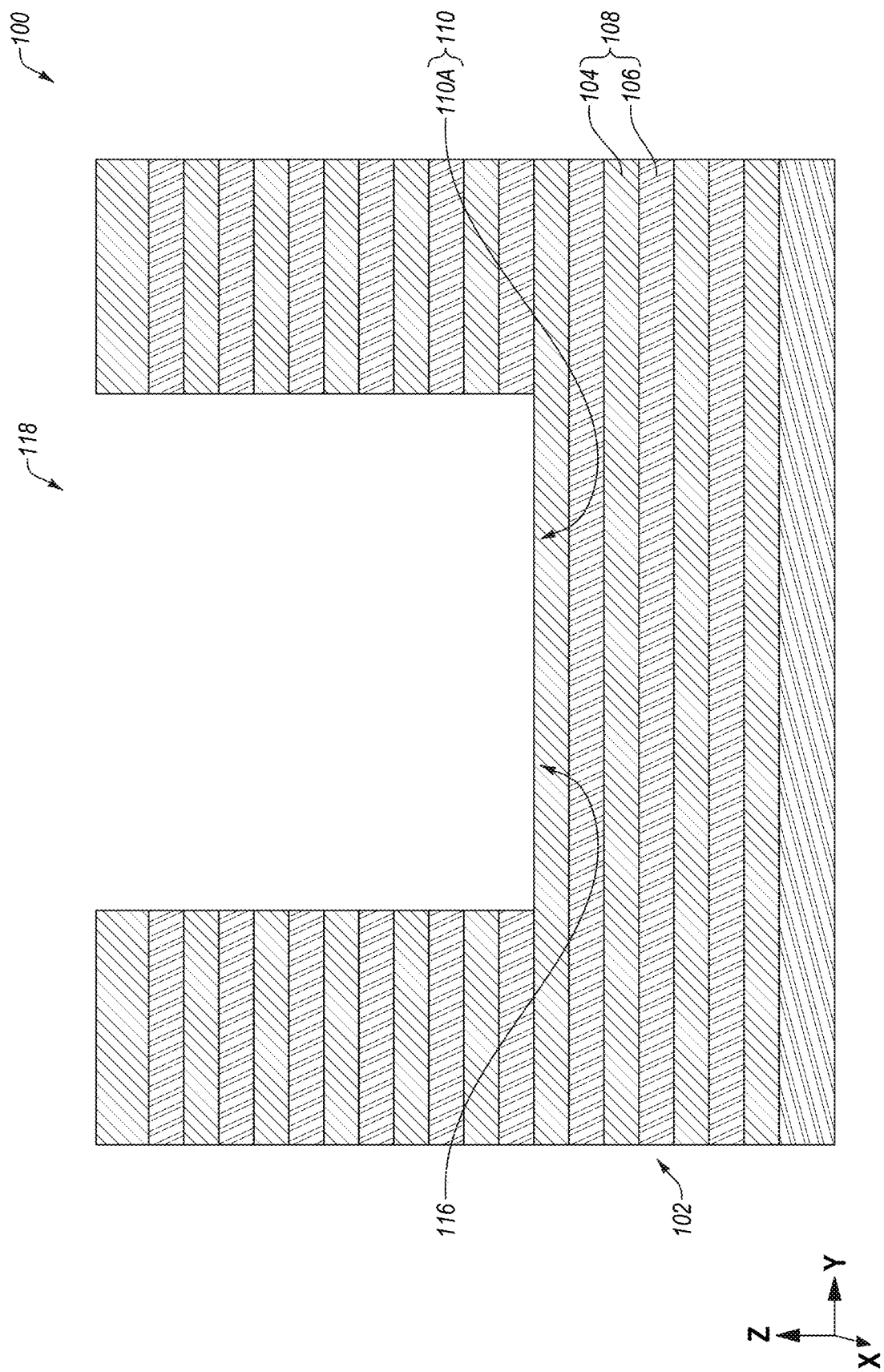
FIG. 1C is a simplified, partial longitudinal cross-sectional view of a portion of the microelectronic device structure at the processing stage of FIGS. 1A and 1B about a dashed line B-B shown in FIG. 1B.

FIG. 1A depicts a simplified, partial perspective view of a microelectronic device structure 100. As shown in FIG. 1A, the microelectronic device structure 100 may be formed to include a preliminary stack structure 102 including a vertically alternating (e.g., in a Z-direction) sequence of insulative material 104 and sacrificial material 106 arranged in tiers 108. Each of the tiers 108 of the preliminary stack structure 102 may individually include the sacrificial material 106 vertically neighboring (e.g., directly vertically adjacent) the insulative material 104. FIG. 1B is a simplified, longitudinal cross-sectional view of a portion A (identified with a dashed box in FIG. 1A) of the microelectronic device structure 100 at the processing stage depicted in FIG. 1A. FIG. 1C is a simplified, partial longitudinal cross-sectional view of a portion of the microelectronic device structure at the processing stage of FIGS. 1A and 1B about a dashed line B-B shown in FIG. 1B.

The insulative material 104 of each of the tiers 108 of the preliminary stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 104 of each of the tiers 108 of the preliminary stack structure 102 is formed of and includes a dielectric oxide material, such as $SiO_x$ (e.g., $SiO_2$). The insulative material 104 of each of the tiers 108 may be substantially homogeneous, or the insulative material 104 of one or more (e.g., each) of the tiers 108 may be heterogeneous.

The sacrificial material 106 of each of the tiers 108 of the preliminary stack structure 102 may be formed of and include at least one material (e.g., at least one insulative material) that may be selectively removed relative to the insulative material 104. The sacrificial material 106 may be selectively etchable relative to the insulative material 104 during common (e.g., collective, mutual) exposure to a first etchant; and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative material 104, the sacrificial material 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xCy$), at least one hydrogenated dielectric oxycarbide material (e.g., $SiC_xO_yH_z$), at least one dielectric carboxynitride material (e.g., $SiO_xC_zN_y$), and at least one semiconductive material (e.g., polycrystalline silicon). In some embodiments, the sacrificial material 106 of each of the tiers 108 of the preliminary stack structure 102 is formed of and includes a dielectric nitride material, such as $SiN_y$ (e.g., $Si_3N_4$). The sacrificial material 106 may, for example, be selectively etchable relative to the insulative material 104 during common exposure to a wet etchant comprising phosphoric acid ($H_3PO_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred twenty-eight (128) of the tiers 108, or greater than or equal to two hundred fifty-six (256) of the tiers 108.

As shown in FIG. 1A, the preliminary stack structure 102 may include stadium structures 110 formed therein. The stadium structures 110 may be distributed throughout the preliminary stack structure 102. As shown in FIG. 1A, the preliminary stack structure 102 may include rows of the stadium structures 110 extending in parallel in a X-direction, and columns of the stadium structures 110 extending in a Y-direction orthogonal to the X-direction. The rows of the stadium structures 110 may individually include some of the stadium structures 110 at least partially (e.g., substantially) aligned with one another in the Y-direction. The columns of the of the stadium structures 110 may individually include other of the stadium structures 110 at least partially (e.g., substantially) aligned with one another in the X-direction. Different rows of the stadium structures 110 may be positioned within different horizontal areas of the preliminary stack structure 102 to be formed into different blocks of a stack structure to be formed from the preliminary stack structure 102, as described in further detail below. In FIG. 1A, for clarity and ease of understanding the drawings and associated description, portions of the preliminary stack structure 102 are depicted as transparent to more clearly show some of the stadium structures 110 distributed within the preliminary stack structure 102.

Still referring to FIG. 1A, at least some (e.g., each) of the stadium structures 110 within an individual row of the stadium structures 110 may be positioned at different vertical elevations in the Z-direction than one another. For example, as depicted in FIG. 1A, an individual row of the stadium structures 110 may include a first stadium structure 110A, a second stadium structure 110B at a relatively lower vertical position (e.g., in the Z-direction) within the preliminary stack structure 102 than the first stadium structure 110A, a third stadium structure 110C at a relatively lower vertical position within the preliminary stack structure 102 than the second stadium structure 110B, and a fourth stadium structure 110D at a relatively lower vertical position within the block 130 than the third stadium structure 110C. In addition, within an individual row of the stadium structures 110, horizontally neighboring (e.g., in the X-direction) stadium structures 110 may be substantially uniformly (e.g., equally, evenly) horizontally spaced apart from one another. In additional embodiments, one or more rows of the stadium structures 110 may individually include a different quantity of stadium structures 110 and/or a different distribution of stadium structures 110 than that depicted in FIG. 1A. For example, an individual row of the stadium structures 110 may include greater than four (4) of the stadium structures 110 (e.g., greater than or equal to five (5) of the stadium structures 110, greater than or equal to ten (10) of the stadium structures 110, greater than or equal to twenty-five (25) of the stadium structures 110, greater than or equal to fifty (50) of stadium structures 110), or less than four (4) of the stadium structures 110 (e.g., less than or equal to three (3) of the stadium structures 110, less than or equal to two (2) of the stadium structures 110, only one (1) of the stadium structures 110). As another example, within an individual row of the stadium structures 110, at least some horizontally neighboring stadium structures 110 may be at least partially non-uniformly (e.g., non-equally, non-evenly) horizontally spaced, such that at least one of the stadium structures 110 of the row is separated from at least two other of the stadium structures 110 of the row horizontally neighboring the at least one stadium structure 110 by different (e.g., non-equal) distances. As an additional non-limiting example, within an individual row of the stadium structures 110, vertical positions (e.g., in the Z-direction) of the stadium structures 110 may vary in a different manner (e.g., may alternate between relatively deeper and relatively shallower vertical positions) than that depicted in FIG. 1A.

Each stadium structure 110 may include opposing staircase structures 112, and a central region 114 horizontally interposed between (e.g., in the X-direction) the opposing staircase structures 112. The opposing staircase structures 112 of each stadium structure 110 may include a forward staircase structure 112A and a reverse staircase structure 112B. A phantom line extending from a top of the forward staircase structure 112A to a bottom of the forward staircase structure 112A may have a positive slope, and another phantom line extending from a top of the reverse staircase structure 112B to a bottom of the reverse staircase structure 112B may have a negative slope. In additional embodiments, one or more of the stadium structures 110 may individually exhibit a different configuration than that depicted in FIG. 1A. As a non-limiting example, at least one stadium structure 110 may be modified to include a forward staircase structure 112A but not a reverse staircase structure 112B (e.g., the reverse staircase structure 112B may be absent), or at least one stadium structure 110 may be modified to include a reverse staircase structure 112B but not a forward staircase structure 112A (e.g., the forward staircase structure 112A may be absent). In such embodiments, the central region 114 horizontally neighbors a bottom of the forward staircase structure 112A (e.g., if the reverse staircase structure 112B is absent), or the central region 114 horizontally neighbors a bottom of the reverse staircase structure 112B (e.g., if the forward staircase structure 112A is absent).

The opposing staircase structures 112 (e.g., the forward staircase structure 112A and the reverse staircase structure 112B) of an individual stadium structure 110 each include steps 116 defined by edges (e.g., horizontal ends) of the tiers 108 of the preliminary stack structure 102. For the opposing staircase structures 112 of an individual stadium structure 110, each step 116 of the forward staircase structure 112A may have a counterpart step 116 within the reverse staircase structure 112B having substantially the same geometric configuration (e.g., shape, dimensions), vertical position (e.g., in the Z-direction), and horizontal distance (e.g., in the X-direction) from a horizontal center (e.g., in the X-direction) of the central region 114 of the stadium structure 110. In additional embodiments, at least one step 116 of the forward staircase structure 112A does not have a counterpart step 116 within the reverse staircase structure 112B having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110; and/or at least one step 116 of the reverse staircase structure 112B does not have a counterpart step 116 within the forward staircase structure 112A having substantially the same geometric configuration (e.g., shape, dimensions), vertical position (e.g., in the Z-direction), and/or horizontal distance (e.g., in the X-direction) from horizontal center (e.g., in the X-direction) of the central region 114 of the stadium structure 110.

Each of the stadium structures 110 of the preliminary stack structure 102 may individually include a desired quantity of steps 116. Each of the stadium structures 110 may include substantially the same quantity of steps 116 as each other of the stadium structures 110, or at least one of the stadium structures 110 may include a different quantity of steps 116 than at least one other of the stadium structures 110. In some embodiments, at least one of the stadium structures 110 includes a different (e.g., greater, lower) quantity of steps 116 than at least one other of the stadium structures 110. As shown in FIG. 1A, in some embodiments, the steps 116 of each of the stadium structures 110 are arranged in order, such that steps 116 directly horizontally adjacent (e.g., in the X-direction) one another correspond to tiers 108 of the preliminary stack structure 102 directly vertically adjacent (e.g., in the Z-direction) one another. In additional embodiments, the steps 116 of at least one of the stadium structures 110 are arranged out of order, such that at least some steps 116 of the stadium structure 110 directly horizontally adjacent (e.g., in the X-direction) one another correspond to tiers 108 of preliminary stack structure 102 not directly vertically adjacent (e.g., in the Z-direction) one another.

With continued reference to FIG. 1A, for an individual stadium structure 110, the central region 114 thereof may horizontally intervene (e.g., in the X-direction) between and separate the forward staircase structure 112A thereof from the reverse staircase structure 112B thereof. The central region 114 may horizontally neighbor a vertically lowermost step 116 of the forward staircase structure 112A and may also horizontally neighbor a vertically lowermost step 116 of the reverse staircase structure 112B. The central region 114 of an individual stadium structure 110 may have desired horizontal dimensions. In addition, the central region 114 of each of the stadium structures 110 may have substantially the same horizontal dimensions as the central region 114 of each other of the stadium structures 110, or the central region 114 of at least one of the stadium structures 110 may have different horizontal dimensions than the central region 114 of at least one other of the stadium structures 110.

Still referring to FIG. 1A, each stadium structure 110 (including the forward staircase structure 112A, the reverse staircase structure 112B, and the central region 114 thereof) within the preliminary stack structure 102 may individually partially define boundaries (e.g., horizontal boundaries, vertical boundaries) of a trench 118 vertically extending (e.g., in the Z-direction) through the preliminary stack structure 102. The portions of the preliminary stack structure 102 horizontally neighboring an individual stadium structure 110 may also partially define the boundaries of the trench 118 associated with the stadium structure 110. The trench 118 may only vertically extend through tiers 108 of the preliminary stack structure 102 defining the forward staircase structure 112A and the reverse staircase structure 112B of the stadium structure 110; or may also vertically extend through additional tiers 108 of the preliminary stack structure 102 not defining the forward staircase structure 112A and the reverse staircase structure 112B of the stadium structure 110, such as additional tiers 108 of the preliminary stack structure 102 vertically overlying the stadium structure 110. Edges of the additional tiers 108 of the preliminary stack structure 102 may, for example, define one or more additional stadium structures vertically overlying and horizontally offset from the stadium structure 110. The trench 118 may subsequently be filled with one or more dielectric materials, as described in further detail below.

As previously described, FIG. 1B is a simplified, longitudinal cross-sectional view of portion A (identified with a dashed box in FIG. 1A) of the microelectronic device structure 100 at the processing stage depicted in FIG. 1A. The portion A encompasses the first stadium structure 110A of an individual row of the stadium structures 110 within the preliminary stack structure 102 (FIG. 1A). The portion A also encompasses regions of the preliminary stack structure 102 horizontally neighboring the first stadium structure 110A in the X-direction and the Y-direction. While additional features (e.g., structures, materials) of the microelectronic device structure 100 are described hereinbelow with reference to the portion A of the microelectronic device structure 100, such additional features may also be formed and included in additional portions of the microelectronic device structure 100, including additional portions encompassing additional stadium structures 110 of the preliminary stack structure 102 (FIG. 1A) and additional regions of the preliminary stack structure 102 having boundaries defined by the additional stadium structures 110.

In addition, as also previously described, FIG. 1C is a simplified, partial longitudinal cross-sectional view of a portion of the microelectronic device structure 100 at the processing stage of FIGS. 1A and 1B about a dashed line B-B shown in FIG. 1B. As shown in FIG. 1C, the insulative material 104 and the sacrificial material 106 of each tier 108 of the preliminary stack structure 102 having horizontal ends defining an individual stadium structure 110 (e.g., the first stadium structure 110A) within the preliminary stack structure 102 may continuously horizontally extend in the X-direction across sides of the stadium structure 110 opposing one another in the Y-direction. In addition, for an individual stadium structure 110 within the preliminary stack structure 102, inner horizontal boundaries (e.g., inner sidewalls) of the preliminary stack structure 102 partially defining the trench 118 associated with (e.g., vertically overlying and within horizontal boundaries of) the stadium structure 110 may be oriented substantially perpendicular to uppermost vertical boundaries (e.g., uppermost surfaces) of the preliminary stack structure 102, or may be oriented substantially non-perpendicular to the uppermost vertical boundaries (e.g., uppermost surfaces) of the preliminary stack structure 102.

Figure 2A:
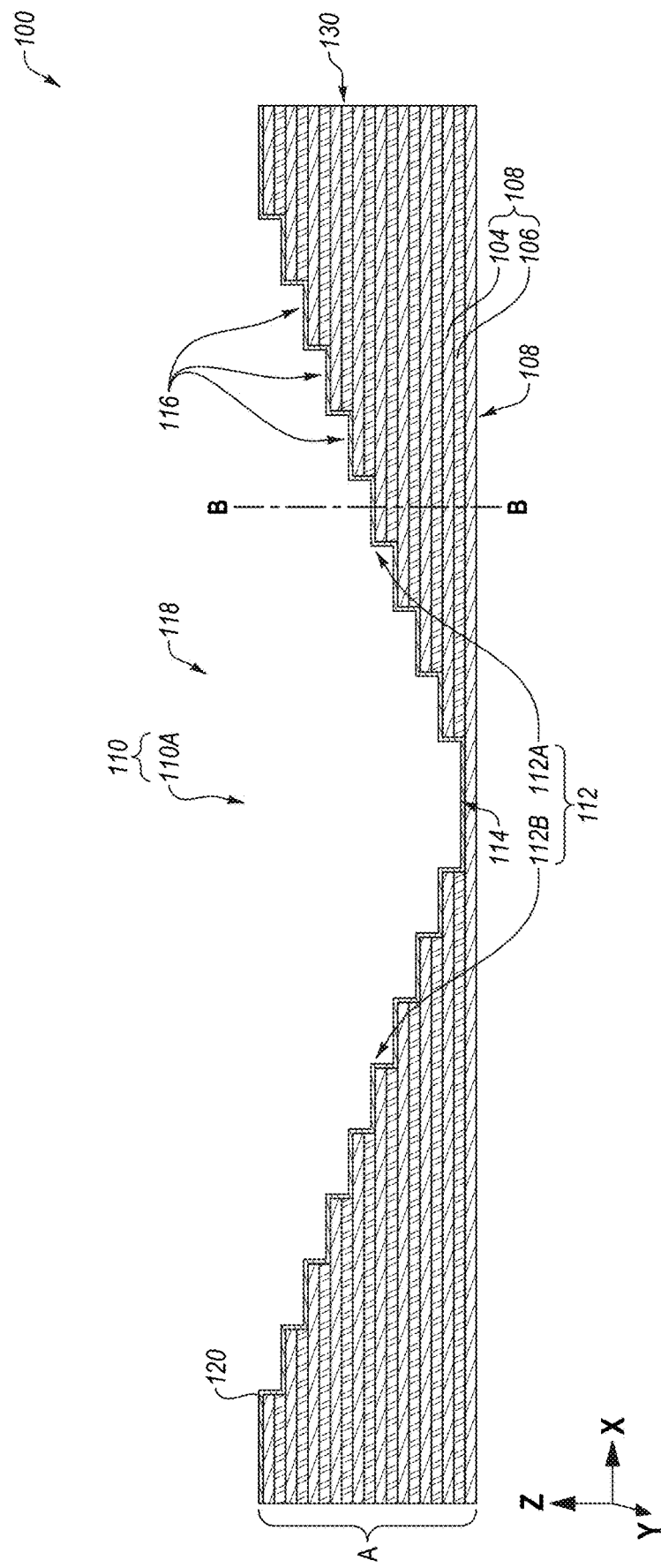
FIG. 2A is a simplified, longitudinal cross-sectional view of the portion A of the microelectronic device structure shown in FIGS. 1A through 1C at another processing stage of the method forming the microelectronic device following the processing stage of FIGS. 1A through 1C.
Figure 2B:
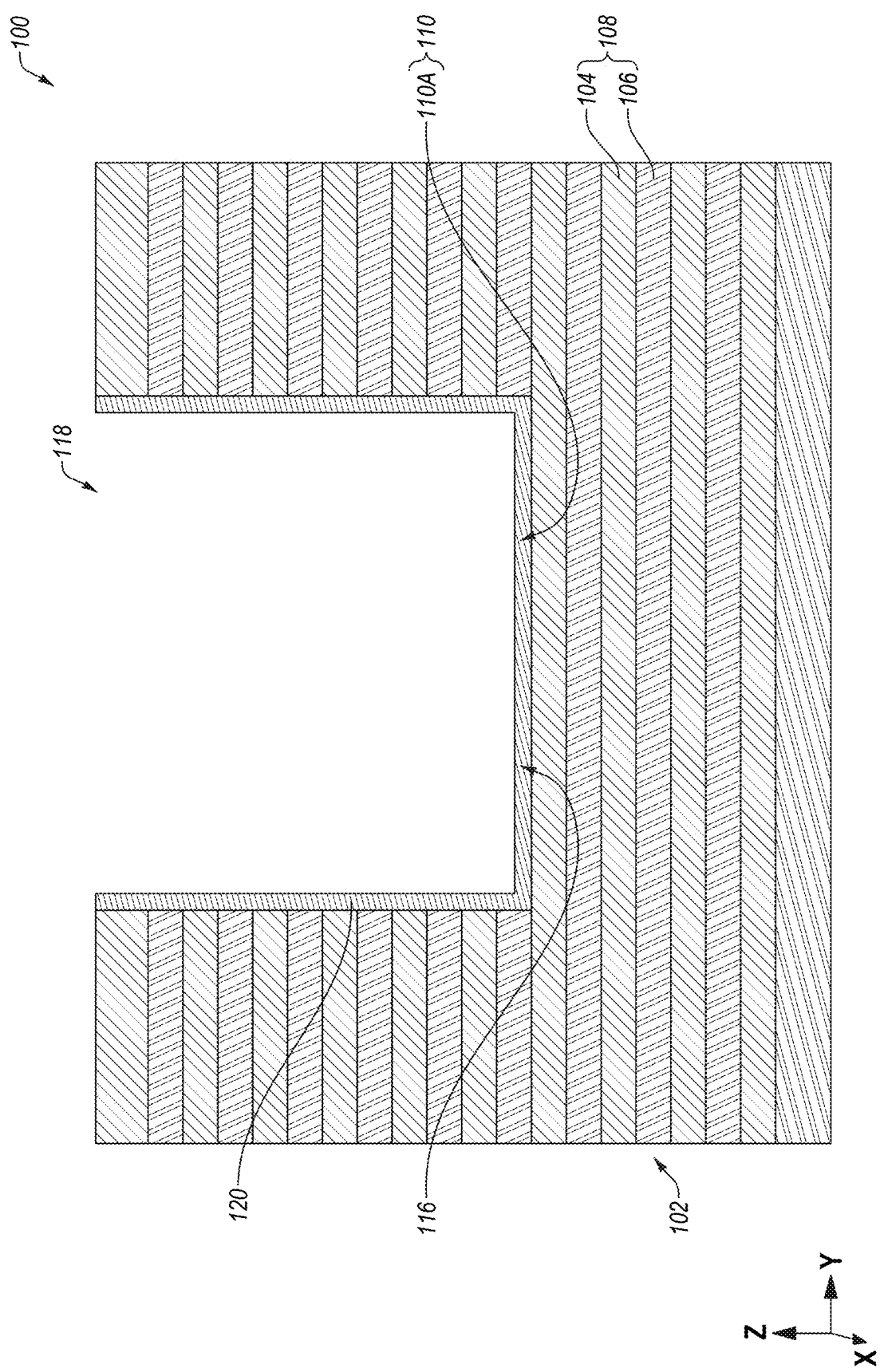
FIG. 2B is a simplified, partial longitudinal cross-sectional view of a portion of the microelectronic device structure at the processing stage of FIG. 2A about the dashed line B-B shown in FIG. 2A.

Referring next to FIG. 2A, which is a simplified, longitudinal cross-sectional view of the portion A of the microelectronic device structure 100 following the processing stage previously described with reference to FIGS. 1A through 1C, a dielectric liner material 120 may be formed on or over portions of the preliminary stack structure 102 defining the stadium structures 110 and the trenches 118. The dielectric liner material 120 may partially (e.g., less than completely) fill each of the trenches 118. For an individual trench 118, the dielectric liner material 120 may be formed to substantially continuously extend on or over surfaces (e.g., horizontally extending surfaces, vertically extending surfaces) of the stadium structure 110 and the preliminary stack structure 102 defining boundaries (e.g., horizontal boundaries, vertical boundaries) of the trench 118. The dielectric liner material 120 may be formed to substantially continuously extend on or over surfaces of the opposing staircase structures 112 (e.g., the forward staircase structure 112A and the reverse staircase structure 112B) of each of the stadium structures 110, as well as on or over inner sidewalls of the preliminary stack structure 102 horizontally neighboring (e.g., in the Y-direction) each of the stadium structures 110. The dielectric liner material 120 may also be formed to extend beyond boundaries (e.g., horizontal boundaries, vertical boundaries) of the trenches 118. For example, dielectric liner material 120 may also be formed to extend over uppermost surfaces of the preliminary stack structure 102 outside the horizontal boundaries (e.g., in the X-direction and in the Y-direction) of the trenches 118. FIG. 2B is a simplified, partial longitudinal cross-sectional view of a portion of the microelectronic device structure 100 at the processing stage of FIG. 2A about a dashed line B-B shown in FIG. 2A.

The dielectric liner material 120 may be employed (e.g., serve) as a barrier material to protect (e.g., mask) subsequently formed structures (e.g., subsequently formed dielectric structures) from removal during subsequent processing acts (e.g., subsequent replacement gate processing acts, such as subsequent etching acts), as described in further detail below. The dielectric liner material 120 may be formed to have a desired thickness capable of protecting the subsequently formed structures during the subsequent processing acts. In some embodiments, a thickness of the dielectric liner material 120 is within a range of from about 5 nanometers (nm) to about 100 nm (e.g., from about 10 nm to about 50 nm, from about 10 nm to about 30 nm).

The dielectric liner material 120 may be formed of and include at least one dielectric material having different etch selectivity than the sacrificial material 106 of the tiers 108 of the preliminary stack structure 102. The dielectric liner material 120 may also have different etch selectivity than at least one additional dielectric material to subsequently be formed within remaining portions the trenches 118. The dielectric liner material 120 may, for example, have etch selectively substantially similar to that of the insulative material 104 of the tiers 108 of the preliminary stack structure 102. By way of non-limiting example, the dielectric liner material 120 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric oxynitride material (e.g., $SiO_xN_y$), and at least one dielectric carboxynitride material (e.g., $SiO_xC_zN_y$). In some embodiments, the dielectric liner material 120 is formed of and includes $SiO_x$ (e.g., $SiO_2$). The dielectric liner material 120 may be substantially homogeneous or may be heterogeneous.

Figure 3A:
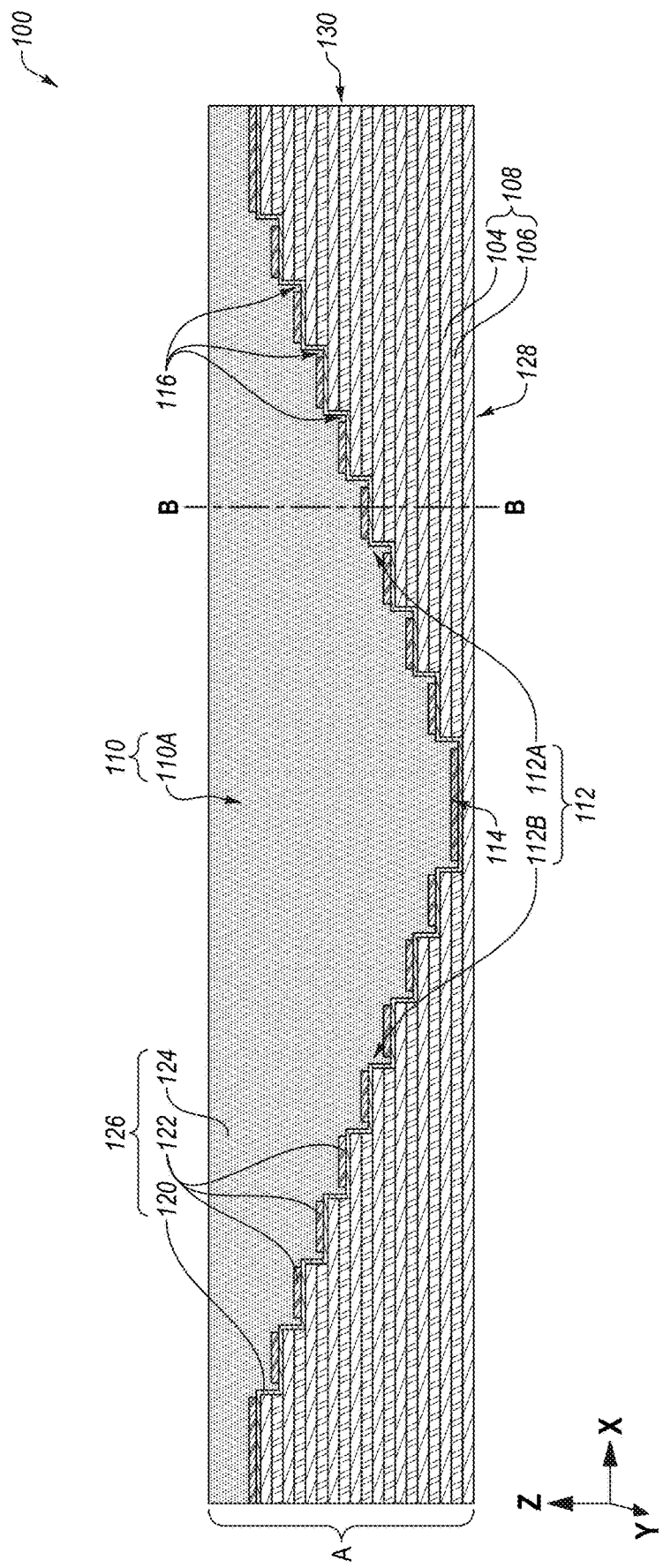
FIG. 3A is a simplified, longitudinal cross-sectional view of the portion A of the microelectronic device structure shown in FIGS. 1A through 1C at another processing stage of the method forming the microelectronic device following the processing stage of FIGS. 2A and 2B.
Figure 3B:
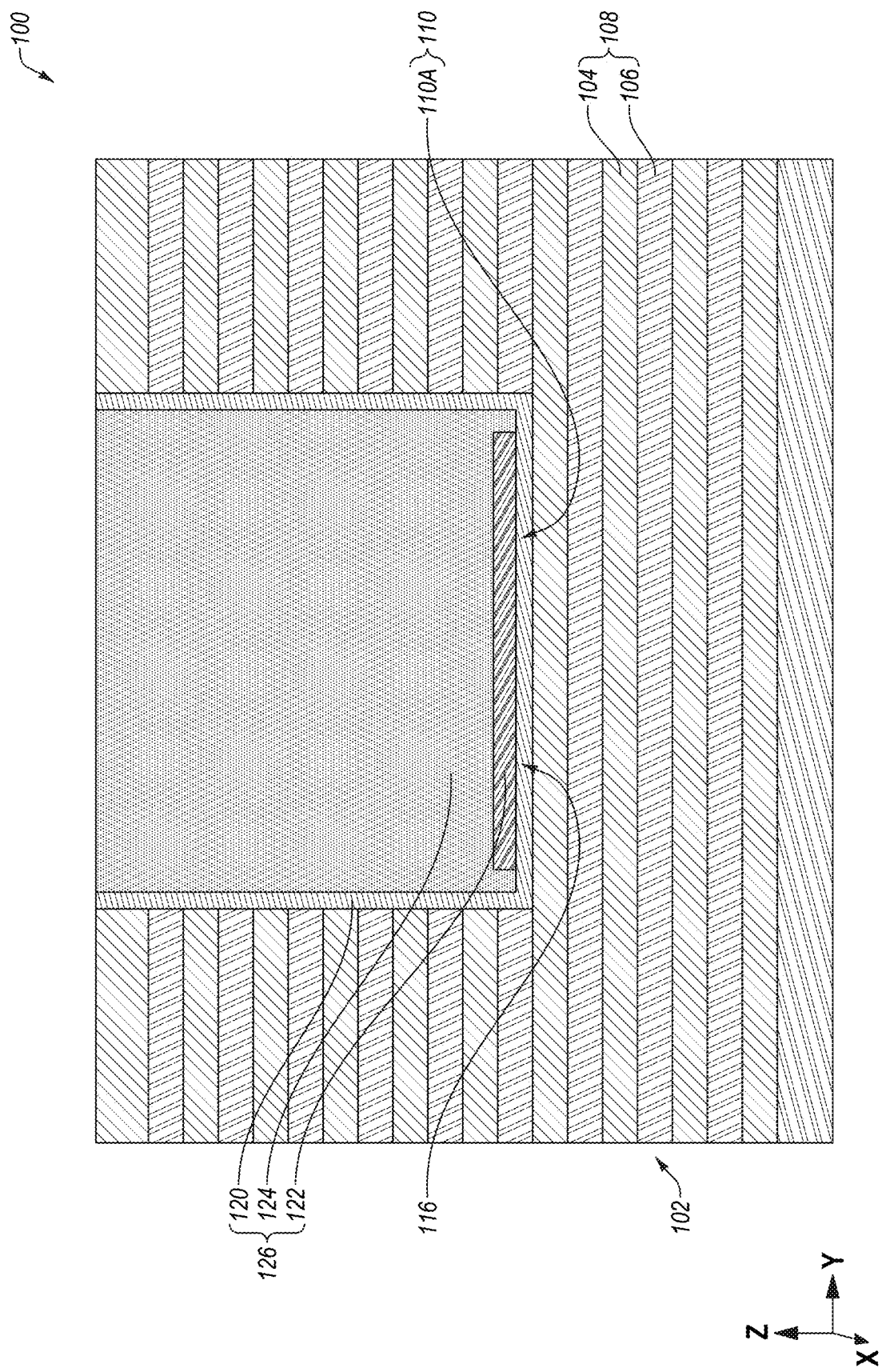
FIG. 3B is a simplified, partial longitudinal cross-sectional view of a portion of the microelectronic device structure at the processing stage of FIG. 3A about the dashed line B-B shown in FIG. 3A.

Referring next to FIG. 3A, which is a simplified, longitudinal cross-sectional view of the portion A of the microelectronic device structure 100 following the processing stage previously described with reference to FIGS. 2A and 2B, dielectric structures 122 (e.g., dielectric mesa structures) may be formed on or over portions of the dielectric liner material 120 within horizontal areas of the steps 116 of the stadium structures 110, and then a dielectric fill material 124 may be formed on or over the dielectric structures 122 and the dielectric liner material 120. The dielectric structures 122 and the dielectric fill material 124 may together substantially fill portions of the trenches 118 (FIGS. 2A and 2B) remaining unfilled following the formation of the dielectric liner material 120. The dielectric liner material 120, the dielectric structures 122, and the dielectric fill material 124 may together form filled trenches 126 individually vertically extending (e.g., in the Z-direction) through the preliminary stack structure 102. FIG. 3B is a simplified, partial longitudinal cross-sectional view of a portion of the microelectronic device structure 100 at the processing stage of FIG. 3A about a dashed line B-B shown in FIG. 3A.

The dielectric structures 122 may be employed (e.g., serve) as etch stop structures during subsequent processing acts (e.g., subsequent etching acts) to form openings (e.g., contact openings, contact vias) vertically extending through the dielectric fill material 124, as described in further detail below. The dielectric structures 122 may be formed to discontinuously extend on or over portions of the dielectric liner material 120 within horizontal boundaries of the stadium structures 110. Individual dielectric structures 122 may be positioned within horizontal boundaries of individual steps 116 of individual stadium structures 110 (e.g., individual steps 116 of the opposing staircase structures 112 thereof, such individual steps 116 the forward staircase structure 112A and/or individual steps 116 of the reverse staircase structure 112B) within the preliminary stack structure 102. As shown in FIG. 3A, for each stadium structure 110, at least one dielectric structure 122 may also be positioned within horizontal boundaries of the central region 114 of the stadium structure 110. Each dielectric structure 122 may be substantially confined within a horizontal area of the step 116 or central region 114 associated therewith. Each dielectric structure 122 within horizontal boundaries of an individual step 116 of an individual stadium structure 110 may have a horizontal area less than a horizontal area of the step 116. In addition, each dielectric structure 122 within horizontal boundaries of an individual central region 114 of an individual stadium structure 110 may have a horizontal area less than a horizontal area of the central region 114. Each dielectric structure 122 may be formed to have a desired thickness capable of protecting the dielectric liner material 120 underlying the dielectric structure 122 from during the subsequent processing acts to form the openings vertically extending through the dielectric fill material 124. In some embodiments, a thickness of each dielectric structure 122 is within a range of from about 10 nm to about 100 nm (e.g., from about 20 nm to about 80 nm).

As shown in FIGS. 3A and 3B, vertically extending (e.g., in the Z-direction) surfaces of the dielectric liner material 120 may be substantially free of the dielectric structures 122 thereon. For example, the dielectric structures 122 may be absent (e.g., omitted) from portions of the dielectric liner material 120 formed on or over vertically extending surfaces of the preliminary stack structure 102 partially defining boundaries of the trenches 118 (FIGS. 1A-1C), such as vertically extending surfaces of the stadium structures 110 and vertically extending surfaces (e.g., sidewalls) of portions of the preliminary stack structure 102 horizontally neighboring the stadium structures 110 (and, hence, also horizontally neighboring the trenches 118). Within horizontal boundaries of an individual stadium structure 110, each of the dielectric structures 122 may be horizontally offset in the X-direction from each other of the dielectric structures 122. In addition, within horizontal boundaries of an individual stadium structure 110, each of the dielectric structures 122 may be at least partially (e.g., substantially) horizontally aligned in the Y-direction with each other of the dielectric structures 122.

The dielectric structures 122 may be formed of and include at least one dielectric material having different etch selectivity than the dielectric liner material 120 and the dielectric fill material 124. The dielectric structures 122 may, for example, have etch selectively substantially similar to that of the sacrificial material 106 of the tiers 108 of the preliminary stack structure 102. By way of non-limiting example, the dielectric structures 122 may be formed of and include at least one nitrogen-containing dielectric material, such as at least one dielectric nitride material. In some embodiments, each of the dielectric structures 122 is each formed of and includes $SiN_y$ (e.g., $Si_3N_4$). The dielectric structures 122 may individually be substantially homogeneous or may individually be heterogeneous.

The dielectric structures 122 may be formed by forming at least one dielectric material on or over the dielectric liner material 120, and then removing portions of the dielectric material on or over vertically extending (e.g., in the Z-direction) surfaces of the dielectric liner material 120 within the trenches 118 (FIGS. 2A and 2B). Additional portions of the dielectric material on or over horizontally extending surfaces of the dielectric liner material 120 within the trenches 118 (FIGS. 2A and 2B) that remain following the material removal process may form the dielectric structures 122. The portions of the dielectric material on or over the vertically extending surfaces of the dielectric liner material 120 may be selectively removed relative to the additional portions of the dielectric material on or over the horizontally extending surfaces of the dielectric liner material 120 by doping the portions or the additional portions with at least one chemical species (e.g., at least one dopant) than modifies the etch selectively of the portions relativity to the additional portions prior to mutual exposure of the portions and the additional portions to at least one etchant. In some embodiments, the additional, horizontally extending portions of the dielectric material are doped with a relatively greater amount of at least one chemical species than the vertically extending portions of the dielectric material, wherein the at least one chemical species effectively decreases an etch rate of the additional, horizontally extending portions relative to the vertically extending portions of the dielectric material during mutual exposure to a predetermined etchant (e.g., a predetermined wet etchant, such as a wet etchant include hydrofluoric acid, HF). By way of non-limiting example, the additional, horizontally extending portions of the dielectric material may be doped with a relatively greater amount of carbon (C) than the vertically extending portions of the dielectric material. In additional embodiments, the vertically extending portions of the dielectric material are doped with a relatively greater amount of at least one chemical species than the additional, horizontally extending portions of the dielectric material, wherein the at least one chemical species effectively increases an etch rate of the vertically extending portions relative to the additional, horizontally extending portions during mutual exposure to a predetermined etchant.

Still referring to FIGS. 3A and 3B, the dielectric fill material 124 may substantially fill portions of the trenches 118 (FIGS. 2A and 2B) unoccupied by the dielectric liner material 120 and the dielectric structures 122. The dielectric fill material 124 may be formed to substantially continuously extend on or over the dielectric structures 122 and the dielectric liner material 120. The dielectric fill material 124 may be formed to exhibit a substantially planer upper vertical boundary, and a substantially non-planar lower vertical boundary complementary to (e.g., substantially mirroring) a topography thereunder.

As shown in FIGS. 3A and 3B, within horizontal boundaries of each of the stadium structures 110, the dielectric fill material 124 covers and surrounds the dielectric structures 122. For example, the dielectric fill material 124 may substantially cover and surround horizontally extending upper surfaces and vertically extending side surfaces of each of the dielectric structures 122. In addition, within horizontal boundaries of each of the stadium structures 110, the dielectric fill material 124 also covers portions of the dielectric liner material 120 not covered by the dielectric structures 122. For example, the dielectric fill material 124 may substantially cover surfaces (e.g., horizontally extending surfaces, vertically extending surfaces) of the dielectric liner material 120 not covered by the dielectric structures 122. Portions of the dielectric fill material 124 may be horizontally interposed (e.g., in the X-direction, in the Y-direction) between the dielectric structures 122 and the dielectric liner material 120.

The dielectric fill material 124 may be formed of and include at least one dielectric material having different etch selectivity than the dielectric structures 122. The dielectric fill material 124 may, for example, have etch selectively substantially similar to that of one or more of the dielectric liner material 120 the insulative material 104 of the tiers 108 of the preliminary stack structure 102. By way of non-limiting example, the dielectric fill material 124 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric oxynitride material (e.g., $SiO_xN_y$), and at least one dielectric carboxynitride material (e.g., $SiO_xC_zN_y$). In some embodiments, the dielectric fill material 124 is formed of and includes $SiO_x$ (e.g., $SiO_2$).

As described in further detail below with reference to FIG. 4C, the microelectronic device structure 100 may be formed to further include support pillars vertically extending through the preliminary stack structure 102. The support pillars may be configured and positioned to support the tiers 108 of the preliminary stack structure 102 during subsequent processing (e.g., replacement gate processing) of the microelectronic device structure 100. For example, the support pillars may be configured and positioned to impede (e.g., substantially prevent) collapse of portions of the insulative material 104 of the tiers 108 with horizontal areas of the stadium structures 110 during subsequent replacement gate processing acts.

Figure 4A:
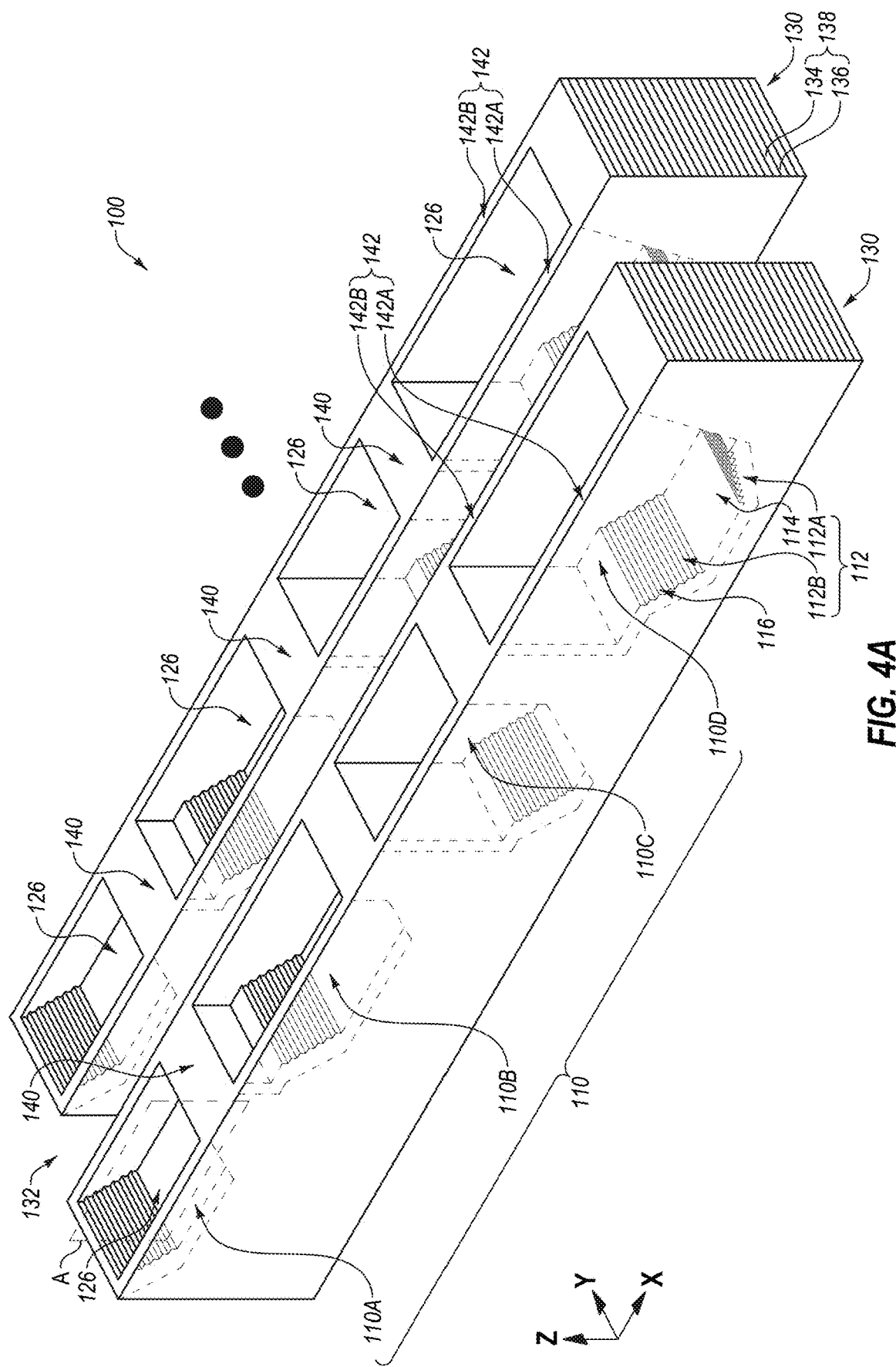
FIG. 4A is a simplified, partial perspective view of a microelectronic device structure shown in FIGS. 1A through 1C at another processing stage of the method forming the microelectronic device following the processing stage of FIGS. 3A and 3B.
Figure 4B:
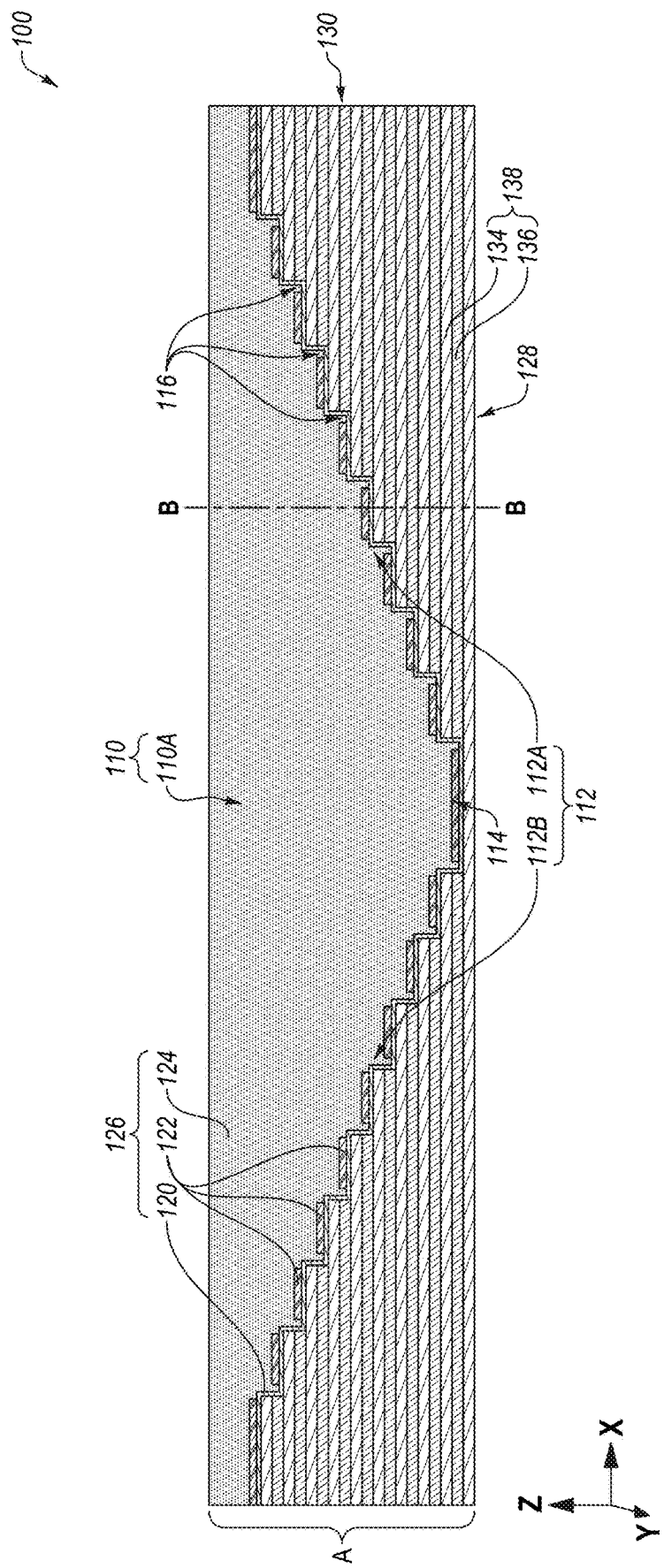
FIG. 4B is a simplified, longitudinal cross-sectional view of the portion A of the microelectronic device structure shown at the processing stage of FIG. 4A.

Referring next to FIG. 4A, which is a simplified, partial perspective view of a microelectronic device structure 100 following the processing stage previously described with reference to FIGS. 3A and 3B, the preliminary stack structure 102 (FIGS. 3A and 3B) may be partitioned (e.g., divided, segmented) and subject to replacement gate processing to form a stack structure 128. The stack structure 128 may be divided into blocks 130 separated from one another by slot structures 132. The slot structures 132 may vertically extend (e.g., in the Z-direction) completely through the stack structure 128. Additional features (e.g., materials, structures) of the stack structure 128 (including the blocks 130 thereof) are described in further detail below. In FIG. 4A, for clarity and ease of understanding the drawings and associated description, the slot structures 132 are depicted as transparent to more clearly show features of the blocks 130. FIG. 4B is a simplified, longitudinal cross-sectional view of the portion A of the microelectronic device structure 100 at the processing stage depicted in FIG. 4A. FIG. 4C is a simplified, partial longitudinal cross-sectional view of a portion of the microelectronic device structure 100 at the processing stage of FIGS. 4A and 4B about a dashed line B-B shown in FIG. 4B.

As shown in FIG. 4A, the blocks 130 of the stack structure 128 may be formed to horizontally extend parallel in an X-direction. As used herein, the term "parallel" means substantially parallel. Horizontally neighboring blocks 130 of the stack structure 128 may be separated from one another in a Y-direction orthogonal to the X-direction by the slot structures 132. The slot structures 132 may also horizontally extend parallel in the X-direction. Each of the blocks 130 of the stack structure 128 may exhibit substantially the same geometric configuration (e.g., substantially the same dimensions and substantially the same shape) as each other of the blocks 130, or one or more of the blocks 130 may exhibit a different geometric configuration (e.g., one or more different dimensions and/or a different shape) than one or more other of the blocks 130. In addition, each pair of horizontally neighboring blocks 130 of the stack structure 128 may be horizontally separated from one another by substantially the same distance (e.g., corresponding to a width in the Y-direction of each of the slot structures 132) as each other pair of horizontally neighboring blocks 130 of the stack structure 128, or at least one pair of horizontally neighboring blocks 130 of the stack structure 128 may be horizontally separated from one another by a different distance than that separating at least one other pair of horizontally neighboring blocks 130 of the stack structure 128. In some embodiments, the blocks 130 of the stack structure 128 are substantially uniformly (e.g., substantially non-variably, substantially equally, substantially consistently) sized, shaped, and spaced relative to one another.

Each of the blocks 130 of the stack structure 128 may be formed to including a vertically alternating (e.g., in a Z-direction) sequence of insulative structures 134 and conductive structures 136 arranged in tiers 138. For an individual blocks 130 of the stack structure 128, each of the tiers 138 may individually include one of the conductive structures 136 vertically neighboring (e.g., directly vertically adjacent) one of the insulative structures 134. The insulative structures 134 of the blocks 130 of the stack structure 128 may comprise portions of the insulative material 104 (FIGS. 3A and 3B) of the preliminary stack structure 102 (FIGS. 3A and 3B) remaining following the formation of the blocks 130. The conductive structures 136 of the blocks 130 of the stack structure 128 may comprise at least one conductive material formed (e.g., deposited) in place of the sacrificial material 106 (FIGS. 3A and 3B) of the preliminary stack structure 102 (FIGS. 3A and 3B) through the replacement gate process, as described in further detail below. The conductive material may be formed of and include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive structures 136 are formed of and includes W. Optionally, at least one liner material (e.g., at least one insulative liner material, at least one conductive liner materials) may be formed around the conductive structures 136. The liner material may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive structures 136. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the block 130 of the stack structure 128, $AlO_x$ (e.g., $Al_2O_3$) may be formed directly adjacent the insulative structures 134, $TiN_x$ (e.g., TiN) may be formed directly adjacent the $AlO_x$, and W may be formed directly adjacent the $TiN_x$. For clarity and ease of understanding the description, the liner material is not illustrated in FIGS. 4A-4C, but it will be understood that the liner material may be disposed around the conductive structures 136.

Within each block 130 of the stack structure 128, one or more conductive structures 136 of one or more relatively vertically higher tiers 138 (e.g., upper tiers) may be employed to form upper select gate structures (e.g., drain side select gate (SGD) structures) for upper select transistors (e.g., drain side select transistors) of the block 130. The conductive structures 136 of the relatively vertically higher tiers 138 may be segmented by one or more filled slot(s) (e.g., filled SGD slot(s)) to form the upper select gate structures of the block 130. In some embodiments, within each block 130 of the stack structure 128, the conductive structures 136 of each of less than or equal to eight (8) relatively higher tiers 138 (e.g., from one (1) relatively vertically higher tier 138 to eight (8) relatively vertically higher tiers 138) of the stack structure 128 is employed to form upper select gate structures (e.g., SGD structures) for the block 130. In addition, within each block 130 of the stack structure 128, the conductive structures 136 of at least some relatively vertically lower tiers 138 vertically underlying the relatively vertically higher tiers 138 may be employed to form access line structures (e.g., word line structures) of the block 130. Moreover, within each block 130 of the stack structure 128, the conductive structures 136 of at least a vertically lowest tier 138 may be employed to form as at least one lower select gate structure (e.g., at least one source side select gate (SGS) structure) for lower select transistors (e.g., source side select transistors) of the block 130.

To form the stack structure 128, including the blocks 130 thereof, slots (e.g., trenches, openings, apertures) having geometric configurations (e.g., shapes, dimensions) and positions corresponding to (e.g., substantially the same as) having geometric configurations (e.g., shapes, dimensions) and positions of the slot structures 132 may be formed in the preliminary stack structure 102 (FIGS. 3A and 3B). Thereafter, the microelectronic device structure 100 may be treated with at least one wet etchant formulated to selectively remove portions of the sacrificial material 106 (FIGS. 3A and 3B) of the tiers 108 (FIGS. 3A and 3B) of the preliminary stack structure 102 (FIGS. 3A and 3B) through the slots. The wet etchant may be selected to remove the portions of the sacrificial material 106 (FIGS. 3A and 3B) without substantially removing portions of the insulative material 104 (FIGS. 3A and 3B) of the tiers 108 (FIGS. 3A and 3B) of the preliminary stack structure 102 (FIGS. 3A and 3B), and without substantially removing portions of the dielectric liner material 120. During the material removal process, the dielectric liner material 120 may protect (e.g., mask) the dielectric structures 122 from being removed. In some embodiments wherein the sacrificial material 106 (FIGS. 3A and 3B) comprises a dielectric nitride material (e.g., $SiN_y$, such as $Si_3N_4$) and the insulative material 104 and the dielectric liner material 120 comprise a dielectric oxide material (e.g., $SiO_x$, such as $SiO_2$), the sacrificial material 106 (FIGS. 3A and 3B) of the tiers 108 (FIGS. 3A and 3B) of the preliminary stack structure 102 (FIGS. 3A and 3B) is at selectively removed using a wet etchant comprising $H_3PO_4$. Following the selective removal of the portions of the sacrificial material 106 (FIGS. 3A and 3B), the resulting recesses may be filled with conductive material to form the conductive structures 136 of the blocks 130 of the stack structure 128. In addition, following the formation of the blocks 130, the slots between the blocks 130 may be filled (e.g., substantially filled) with at least one dielectric material (e.g., at least one dielectric oxide material, such as $SiO_x$; at least one dielectric nitride material, such as $SiN_y$) to form the slot structures 132. In some embodiments, the slot structures 132 are formed of and include $SiO_2$. The slot structures 132 may individually be formed to be substantially homogeneous or may individually be formed to be heterogeneous.

Referring again to FIG. 4A, each block 130 of the stack structure 128 may individually be formed to include a row of the stadium structures 110 (e.g., including the first stadium structure 110A, the second stadium structure 110B, the third stadium structure 110C, and the fourth stadium structure 110D of the row), crest regions 140 (e.g., elevated regions), and bridge regions 142 (e.g., additional elevated regions). The stadium structures 110 may be distributed throughout and substantially confined within a horizontal area of the block 130. The crest regions 140 may be horizontally interposed between stadium structures 110 horizontally neighboring one another in the X-direction. The bridge regions 142 may horizontally neighbor opposing sides of individual stadium structures 110 in the Y-direction and may horizontally extend from and between crest regions 140 horizontally neighboring one another in the X-direction. In FIG. 4A, for clarity and ease of understanding the drawings and associated description, portions (e.g., some of the bridge regions 142 horizontally neighboring first sides of the stadium structures 110 in the Y-direction) of one of the blocks 130 of the stack structure 128 are depicted as transparent to more clearly show the stadium structures 110 distributed within the block 130.

As shown in FIG. 4A, the crest regions 140 of an individual block 130 of the stack structure 128 may intervene between and separate stadium structures 110 horizontally neighboring one another in the X-direction. For example, one of the crest regions 140 may intervene between and separate the first stadium structure 110A and the second stadium structure 110B, an additional one of the crest regions 140 may intervene between and separate the second stadium structure 110B and the third stadium structure 110C; and a further one of the crest regions 140 may intervene between and separate the third stadium structure 110C and the fourth stadium structure 110D. A vertical height of the crest regions 140 in the Z-direction may be substantially equal to a maximum vertical height of the block 130 in the Z-direction; and a horizontal width of the crest regions 140 in the Y-direction may be substantially equal to a maximum horizontal width of the block 130 in the Y-direction. In addition, each of the crest regions 140 may individually exhibit a desired horizontal length in the X-direction. Each of the crest regions 140 of an individual block 130 of the stack structure 128 may exhibit substantially the same horizontal length in the X-direction as each other of the crest regions 140 of the block 130; or at least one of the crest regions 140 of the block 130 may exhibit a different horizontal length in the X-direction than at least one other of the crest regions 140 of the block 130.

Still referring to FIG. 4A, the bridge regions 142 of an individual block 130 of the stack structure 128 may be formed to intervene between and separate the stadium structures 110 of the block 130 from the slot structures 132 horizontally neighboring the block 130 in the Y-direction. For example, for each stadium structure 110 within an individual block 130 of the stack structure 128, a first bridge region 142A may be horizontally interposed in the Y-direction between a first side of the stadium structure 110 and a first of the slot structures 132 horizontally neighboring the block 130; and a second bridge region 142B may be horizontally interposed in the Y-direction between a second side of the stadium structure 110 and a second of the slot structures 132 horizontally neighboring the block 130. The first bridge region 142A and the second bridge region 142B may horizontally extend in parallel in the X-direction. In addition, the first bridge region 142A and the second bridge region 142B may each horizontally extend from and between crest regions 140 of the block 130 horizontally neighboring one another in the X-direction. The bridge regions 142 of the block 130 may be integral and continuous with the crest regions 140 of the block 130. Upper boundaries (e.g., upper surfaces) of the bridge regions 142 may be substantially coplanar with upper boundaries of the crest regions 140. A vertical height of the bridge regions 142 in the Z-direction may be substantially equal to a maximum vertical height of the block 130 in the Z-direction. In addition, each of the bridge regions 142 (including each first bridge region 142A and each second bridge region 142B) may individually exhibit a desired horizontal width in the Y-direction and a desired horizontal length in the X-direction. Each of the bridge regions 142 of the block 130 may exhibit substantially the same horizontal length in the X-direction as each other of the bridge regions 142 of the block 130; or at least one of the bridge regions 142 of the block 130 may exhibit a different horizontal length in the X-direction than at least one other of the bridge regions 142 of the block 130. In addition, each of the bridge regions 142 of the block 130 may exhibit substantially the same horizontal width in the Y-direction as each other of the bridge regions 142 of the block 130; or at least one of the bridge regions 142 of the block 130 may exhibit a different horizontal width in the Y-direction than at least one other of the bridge regions 142 of the block 130.

For each block 130 of the stack structure 128, the bridge regions 142 thereof horizontally extend around the filled trenches 126 of the block 130. Some of the bridge regions 142 of the block 130 may be employed to form continuous conductive paths extending from and between horizontally neighboring crest regions 140 of the block 130. As shown in FIG. 4C, the dielectric liner material 120 of the filled trenches 126 may be positioned directly horizontally adjacent (e.g., in the Y-direction) inner side surfaces (e.g., inner sidewalls) of the bridge regions 142, and the slot structures 132 may be positioned directly horizontally adjacent (e.g., in the Y-direction) outer side surfaces (e.g., outer sidewalls) of the bridge regions 142. Vertically extending portions of dielectric liner material 120 directly horizontally adjacent the inner side surfaces of the bridge regions 142 are substantially free of the dielectric structures 122 thereon. Instead, the dielectric fill material 124 of the filled trenches 126 may be positioned directly horizontally adjacent (e.g., in the Y-direction) and may substantially cover inner side surfaces (e.g., inner sidewalls) of the vertically extending portions of dielectric liner material 120. In addition, for each filled trench 126, the dielectric liner material 120 is vertically interposed between upper boundaries of the steps 116 of the stadium structure 110 associated with the filled trench 126 and lower boundaries of the dielectric structures 122 within horizontal boundaries of the steps 116.

Figure 4C:
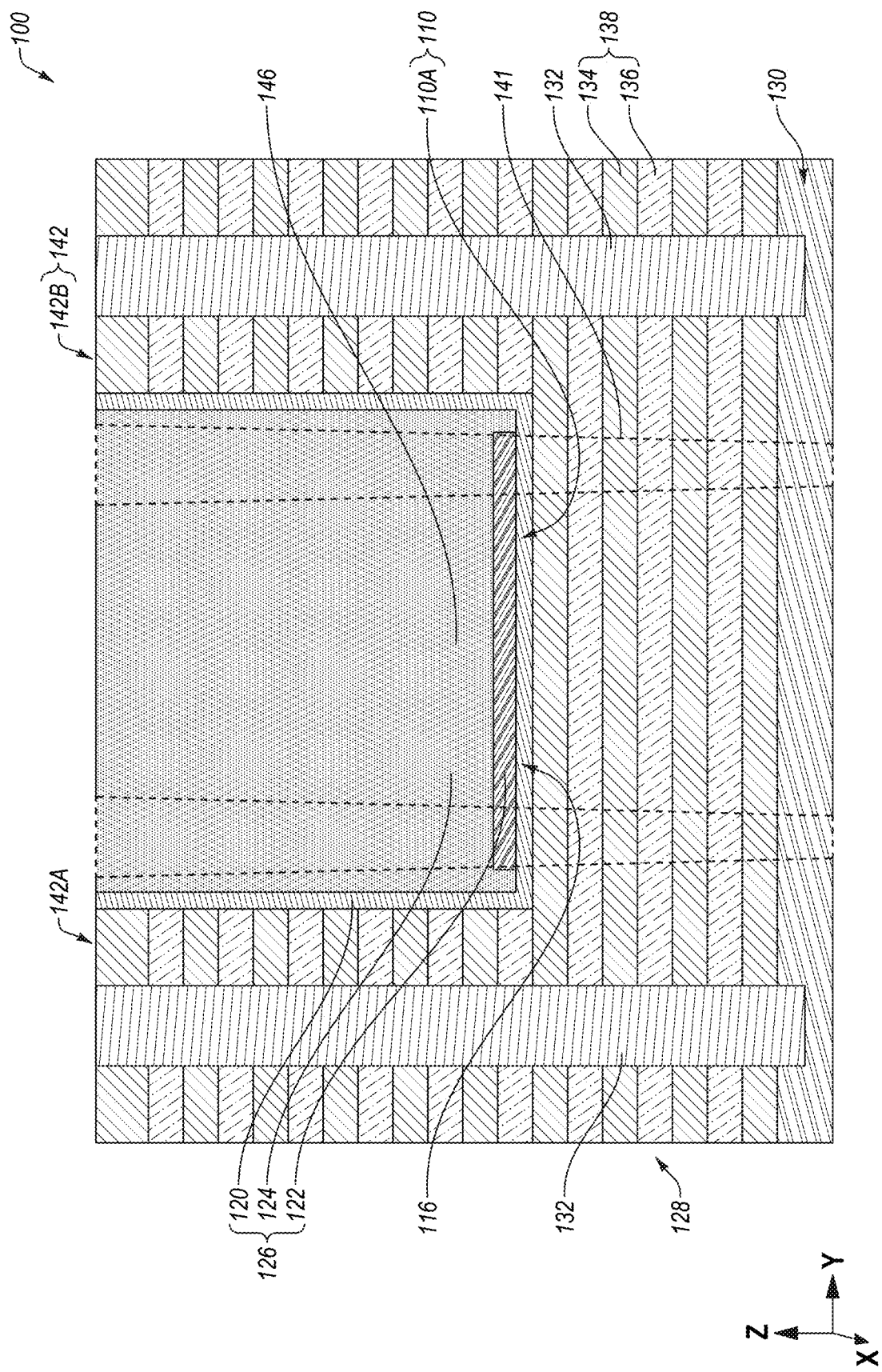
FIG. 4C is a simplified, partial longitudinal cross-sectional view of a portion of the microelectronic device structure at the processing stage of FIGS. 4A and 4B about a dashed line B-B shown in FIG. 4B.

Referring to FIG. 4C, during and after the replacement gate process to form the stack structure 128, the configuration of the filled trenches 126 (including the configurations of the dielectric liner material 120, the dielectric structures 122, and the dielectric fill material 124 thereof) provides several advantages. For example, the configuration of the dielectric liner material 120 of each filled trench 126 protects the dielectric structures 122 of the filled trenches 126 from removal and replacement with conductive material during the replacements gate process, and thus prevents the formation of undesirable void spaces that may otherwise result from replacing the dielectric structures 122 with the conductive material. Such void spaces may, for example, otherwise be formed at interfaces of the conductive material that would replace the dielectric structures 122 and the conductive structures 136 of individual blocks 130 of the stack structure 128 at steps 116 of the stadium structures 110. Maintaining the dielectric structures 122 also facilitates subsequent use of the dielectric structures 122 as so-called "etch stop" structures to mitigate (e.g., prevent) undesirable damage (e.g., over-etching damage, punch-through damage) to tiers 138 of individual blocks 130 of the stack structure 128 during subsequent processing to form contact openings within boundaries of the blocks 130, as described in further detail below. As another example, the configurations of the dielectric structures 122 of each filled trench 126 prevents undesirable damage, defects, and/or processing difficulties that may otherwise occur if the dielectric structures 122 vertically extended across and substantially covered (e.g., substantially lined) vertically extending portions of dielectric liner material 120. Omitting the dielectric structures 122 from vertically extending portions of the dielectric liner material 120 may, for example, prevent undesirable short circuits between the conductive structures 136 of different tiers 138 of an individual block 130 that may otherwise result from defects within the dielectric liner material 120 ahead of the replacement gate processing. Such defects may, for example, otherwise provide an access point for undesirable replacement of vertically extending portions of such dielectric structure configurations with conductive material during the replacement gate processing.

Still referring to FIG. 4C, each block 130 of the stack structure 128 may individually be formed to have a desired distribution of support structures 141 (e.g., support contacts, support pillars) (depicted by way of dashed lines in FIG. 4C) vertically extending therethrough. The support structures 141 may, for example, be formed in the preliminary stack structure 102 (FIGS. 3A and 3B) prior to the replacement gate processing to form the conductive structures 136 of the blocks 130 of the stack structure 128. The support structures 141 may be configured and positioned to facilitating support of the insulative material 104 (FIGS. 3A and 3B) of each of the tiers 108 (FIGS. 3A and 3B) of the preliminary stack structure 102 (FIGS. 3A and 3B) during replacement of the sacrificial material 106 (FIGS. 3A and 3B) of the tiers 108 (FIGS. 3A and 3B) with the conductive structures 136. In some embodiments, each block 130 of the stack structure 128 includes at least one array of the support structures 141 vertically extending therethrough, including rows of the support structures 141 extending in the X-direction, and columns of the support structures 141 extending to the Y-direction. For each block 130, portions of the at least one array of the support structures 141 may be located within horizontal areas of the stadium structures 110 within the block 130.

The support structures 141 may each individually be formed to exhibit a desired horizontal cross-sectional shape. In some embodiments, each of the support structures 141 is formed to exhibit a substantially circular horizontal cross-sectional shape. In additional embodiments, one or more (e.g., each) of the support structures 141 exhibits a non-circular cross-sectional shape, such as one of more of a square cross-sectional shape, a rectangular cross-sectional shape, an oblong cross-sectional shape, an elliptical cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, and an irregular cross-sectional shape. In addition, each of the support structures 141 may be formed to exhibit substantially the same horizontal cross-sectional dimensions (e.g., substantially the same horizontal diameter), or at least one of the support structures 141 may be formed to exhibit one or more different horizontal cross-sectional dimensions (e.g., a different horizontal diameter) than at least one other of the support structures 141. In some embodiments, all of the support structures 141 are formed to exhibit substantially the same horizontal cross-sectional dimensions.

The support structures 141 may each individually be formed of and include at least one conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Coand Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In addition, at least one insulative liner material may be formed to substantially surround (e.g., substantially horizontally and vertically cover) side surfaces (e.g., sidewalls) of each of the support structures 141. The insulative liner material may be horizontally interposed between the support structures 141 and the tiers 138 of the blocks 130 of the stack structure 128. The insulative liner material may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the insulative liner material comprises $SiO_2$.

Figure 5A:
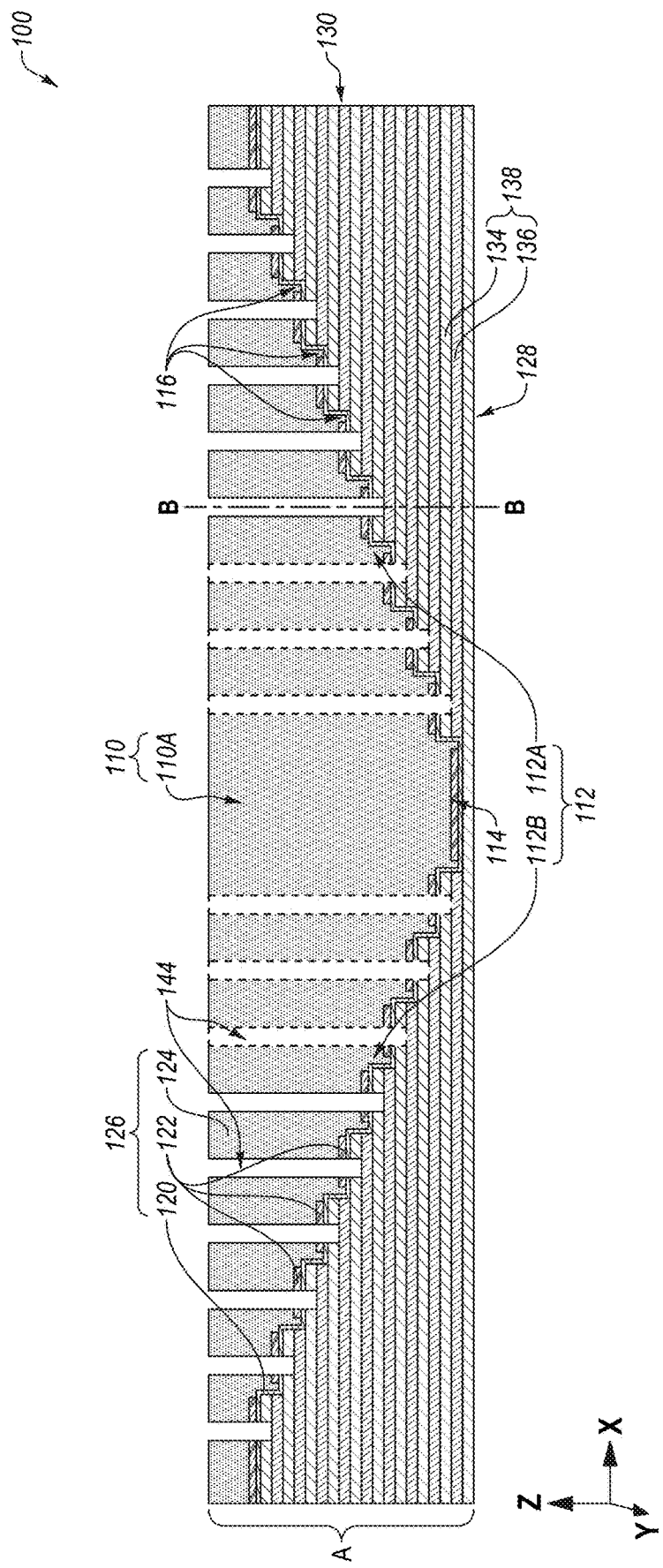
FIG. 5A is a simplified, longitudinal cross-sectional view of the portion A of the microelectronic device structure shown in FIGS. 1A through 1C at another processing stage of the method forming the microelectronic device following the processing stage of FIGS. 4A through 4C.
Figure 5B:
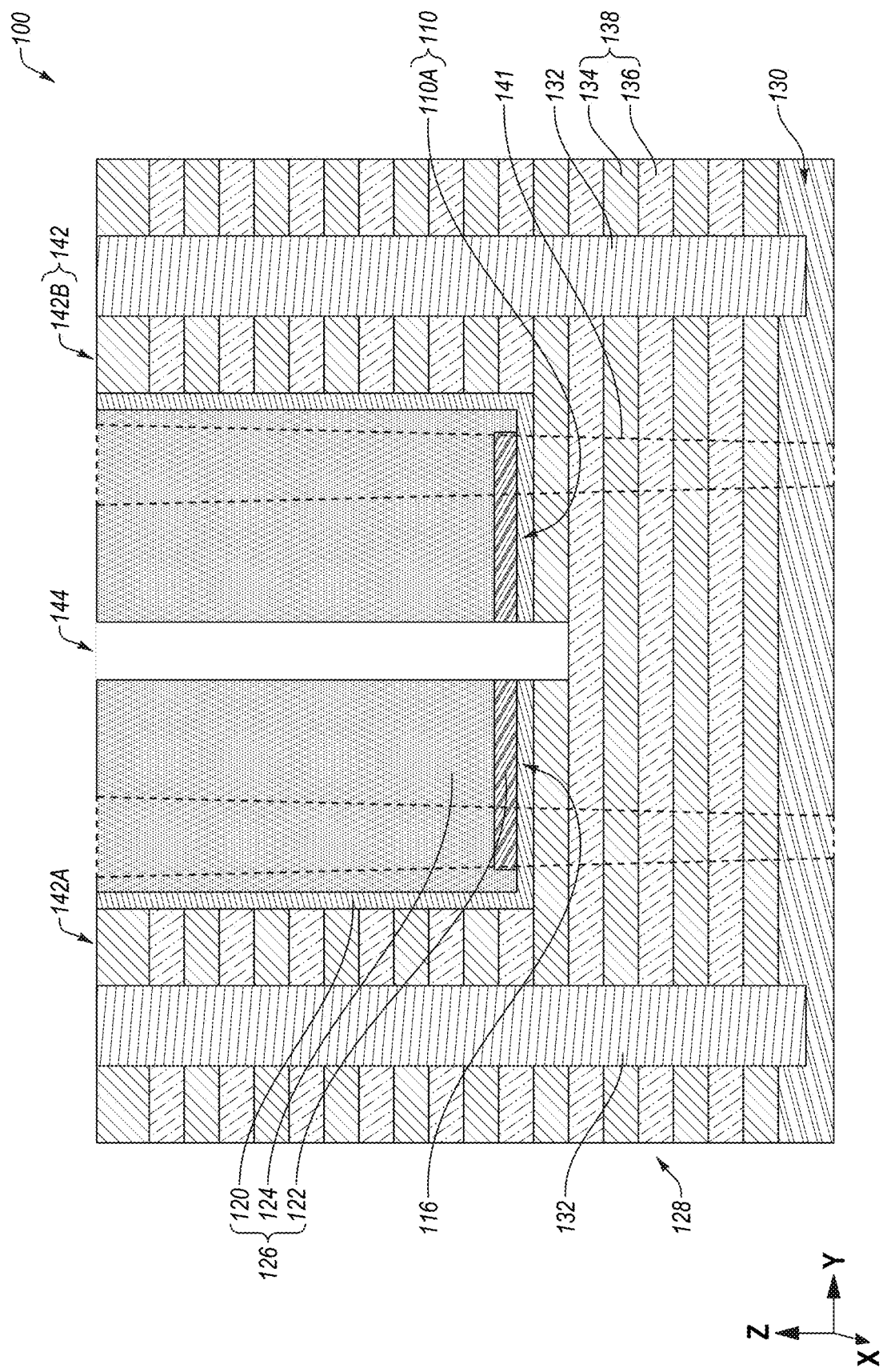
FIG. 5B is a simplified, partial longitudinal cross-sectional view of a portion of the microelectronic device structure at the processing stage of FIG. 5A about the dashed line B-B shown in FIG. 5A.

Referring next to FIG. 5A, which is a simplified, longitudinal cross-sectional view of the portion A of the microelectronic device structure 100 following the processing stage previously described with reference to FIGS. 4A through 4C, for each block 130 of the stack structure 128, portions of at least the dielectric fill material 124, the dielectric structures 122, and the dielectric liner material 120 are removed (e.g., etched) to form contact openings 144 (e.g., apertures, vias) vertically extending (e.g., in the Z-direction) therethrough. The contact openings 144 may also individual vertically extend through the insulative structure 134 of a tier 138 of the block 130. The contact openings 144 may vertically extend to or into steps 116 of one or more (e.g., each) of the stadium structures 110, such as steps 116 of the forward staircase structure 112A of one or more of the stadium structures 110 and/or steps 116 of the reverse staircase structure 112B of one or more of the stadium structures 110. A bottom (e.g., lower vertical end) of each contact opening 144 may expose and be defined by an upper surface of the conductive structures 136 of an individual tier 138 of the stack structure 128 at an individual step 116 of an individual stadium structure 110 of an individual block 130 of the stack structure 128. FIG. 5B is a simplified, partial longitudinal cross-sectional view of a portion of the microelectronic device structure 100 at the processing stage of FIG. 5A about a dashed line B-B shown in FIG. 5A.

Within each block 130 of the stack structure 128, each contact opening 144 may be formed at desired a horizontal position (e.g., in the X-direction and the Y-direction) on or over one of the steps 116 of one of the stadium structures 110. In some embodiments, within a horizontal area of one or more of the stadium structures 110, at least some of the contact openings 144 are horizontally offset in the Y-direction from at least some other of the contact openings 144. In FIG. 5A, such horizontal offset is depicted by way of dashed lines at the boundaries (e.g., horizontal boundaries, vertical boundaries) of the contact openings 144. In addition, individual steps 116 of an individual stadium structure 110 (e.g., individual steps 116 of the forward staircase structure 112A thereof, individual steps 116 of the reverse staircase structure 112B thereof) may have a single (e.g., only one) contact opening 144 vertically extending thereto, may have multiple (e.g., more than one) contact openings 144 vertically extending thereto, or may have no contact openings 144 vertically extending thereto.

The contact openings 144 may each individually be formed to exhibit a desired horizontal cross-sectional shape. In some embodiments, each of the contact openings 144 is formed to exhibit a substantially circular horizontal cross-sectional shape. In additional embodiments, one or more (e.g., each) of the contact openings 144 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, and an irregular cross-sectional shape. In addition, each of the contact openings 144 may be formed to exhibit substantially the same horizontal cross-sectional dimensions (e.g., substantially the same horizontal diameter), or at least one of the contact openings 144 may be formed to exhibit one or more different horizontal cross-sectional dimensions (e.g., a different horizontal diameter) than at least one other of the contact openings 144. In some embodiments, all of the contact openings 144 are formed to exhibit substantially the same horizontal cross-sectional dimensions.

The contact openings 144 may be formed using multiple material removal acts. For example, portions of the dielectric fill material 124 may be removed using a first material removal act (e.g., a first etching process) to form preliminary contact openings vertically extending to and exposing portions of the dielectric structures 122; and then portions of at least the dielectric structures 122 and the dielectric liner material 120 within horizontal boundaries of the preliminary contact openings may be removed using a second material removal act (e.g., a second etching process) to vertically extend the preliminary contact openings to the steps 116 of the stadium structures 110 and form the contact openings 144. As shown in FIG. 5A, depending on the sequence of the conductive structures 136 and the insulative structures 134 of the blocks 130 of the stack structure 128, the second material removal act extend the preliminary contact openings through insulative structures 134 of tiers 139 of the blocks 130 defining the steps 116 of the stadium structures 110. As a non-limiting example, the first material removal act may comprise a first etching process (e.g., anisotropic dry etching, such as one or more of RIE, deep RIE, plasma etching, reactive ion beam etching, and chemically assisted ion beam etching); and the second material removal act may comprise a second, different etching process (e.g., a so-called "punch through" etch). During the first etching process, the dielectric structures 122 may serve as a so-called "etch stop" structures to protect underlying portions of the dielectric liner material 120 and the stack structure 128 from removal.

Figure 6A:
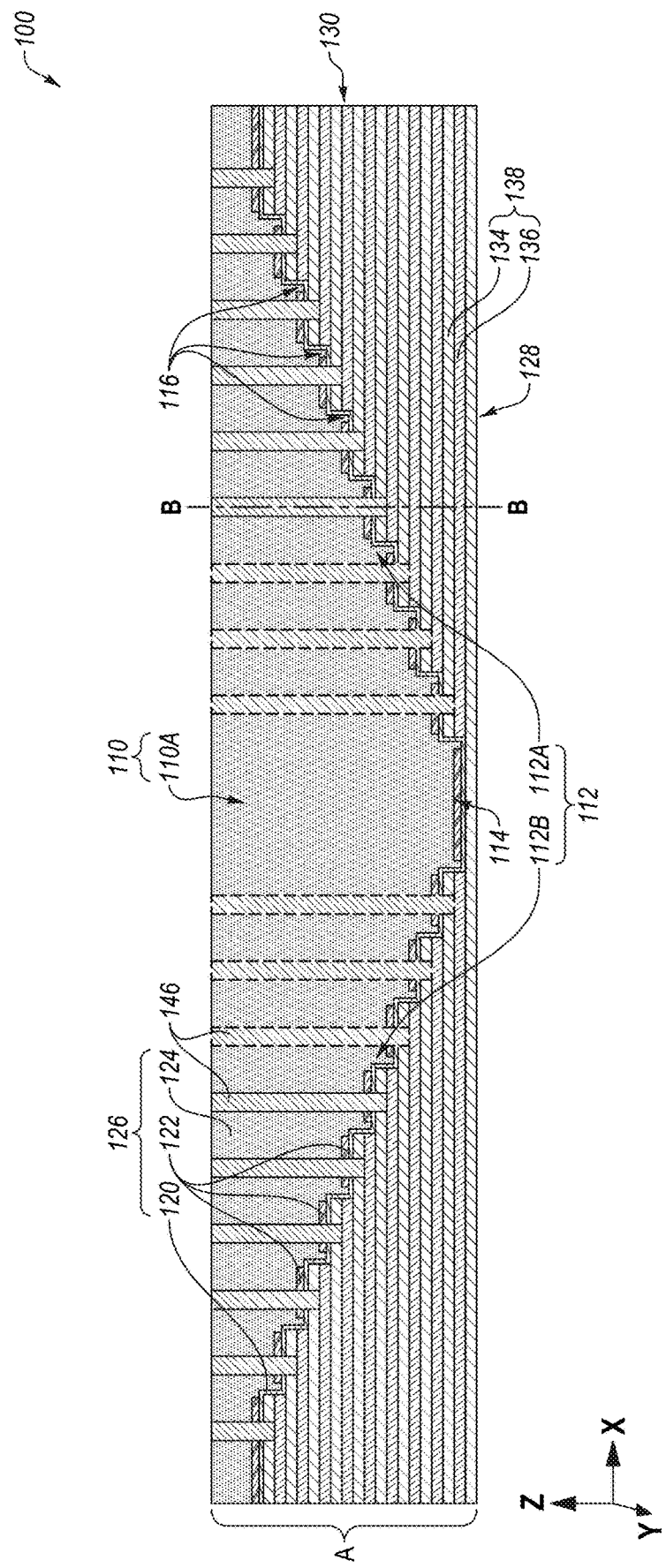
FIG. 6A is a simplified, longitudinal cross-sectional view of the portion A of the microelectronic device structure shown in FIGS. 1A through 1C at another processing stage of the method forming the microelectronic device following the processing stage of FIGS. 5A and 5B.

Referring next to FIG. 6A, which is a simplified, longitudinal cross-sectional view of the portion A of the microelectronic device structure 100 following the processing stage previously described with reference to FIGS. 5A and 5B, contact structures 146 may be formed within the contact openings 144 (FIGS. 5A and 5B). The contact structures 146 may be substantially confined within boundaries (e.g., horizontal boundaries, vertical boundaries) of the contact openings 144 (FIGS. 5A and 5B) and may substantially fill the contact openings 144 (FIGS. 5A and 5B). Each contact structure 146 may have a geometric configuration (e.g., shape, dimensions) corresponding to (e.g., substantially the same as) a geometric configuration of the contact opening 144 (FIGS. 5A and 5B) filled with the contact structure 146. As shown in FIG. 6A, each contact structure 146 may have an uppermost vertical boundary (e.g., an uppermost surface) substantially coplanar with an uppermost vertical boundary (e.g., an uppermost surface) of the dielectric fill material 124, and a lowermost vertical boundary (e.g., a lowermost surface) vertically adjacent an uppermost vertical boundary (e.g., an uppermost surface) of the conductive structure 136 of an individual tier 138 of an individual block 130 the stack structure 128. In additional embodiments, one or more (e.g., each) of the contact structures 146 may have an uppermost vertical boundary offset from (e.g., vertically over, vertically under) an uppermost vertical boundary (e.g., an uppermost surface) of the dielectric fill material 124. Each contact structure 146 may individually contact (e.g., physically contact, electrically contact) the conductive structure 136 of the individual tier 138 of the stack structure 128 at an individual step 116 of an individual stadium structure 110 of an individual block 130 of the stack structure 128.

The contact structures 146 may be formed of and include conductive material. As a non-limiting example, the contact structures 146 may be formed of and include one or more of at least one metal, at least one alloy, and at least one conductive metal-containing material (e.g., a conductive metal nitride, a conductive metal silicide, a conductive metal carbide, a conductive metal oxide). A material composition of the contact structures 146 may be substantially the same as a material composition of the conductive structures 136 of the tiers 138 of the blocks 130 of the stack structure 128, or the material composition of the contact structures 146 may be different than the material composition of the conductive structures 136 of the tiers 138 of the blocks 130 of the stack structure 128. In some embodiments, the contact structures 146 are individually formed of and include W. The contact structures 146 may individually be homogeneous, or the contact structures 146 may individually be heterogeneous.

The contact structures 146 may be formed by forming (e.g., non-conformably depositing, such as through one or more of a PVD process and a non-conformal CVD process) conductive material inside and outside of the contact openings 144 (FIGS. 5A and 5B), and then removing (e.g., through an abrasive planarization process, such as a CMP process) portions of the conductive material overlying an uppermost vertical boundary (e.g., an uppermost surface) of the dielectric fill material 124.

Thus, in accordance with embodiments of the disclosure, a microelectronic device comprises a stack structure comprising blocks separated from one another by dielectric slot structures and each including a vertically alternating sequence of conductive structures and insulative structures arranged in tiers. At least one of the blocks comprises two crest regions, a stadium structure interposed between the two crest regions in a first horizontal direction and comprising opposing staircase structures each having steps comprising edges of the tiers, and two bridge regions neighboring opposing sides of the stadium structure in a second horizontal direction orthogonal to the first horizontal direction and having upper surfaces substantially coplanar with upper surfaces of the two crest regions. A filled trench vertically overlies and is within horizontal boundaries of the stadium structure of the at least one of the blocks. The filled trench comprises a dielectric liner material on the opposing staircase structures of the stadium structure and on inner sidewalls of the two bridge regions, and dielectric structures on the dielectric liner material and having a different material composition than the dielectric liner material. The dielectric structures are substantially confined within horizontal areas of the steps of the stadium structure.

Furthermore, in accordance with embodiments of the disclosure, a method of forming a microelectronic device comprises forming a preliminary stack structure comprising a vertically alternating sequence of sacrificial material and insulative material arranged in tiers. The preliminary stack structure further comprises rows of stadium structures each comprising at least two of the stadium structures neighboring one another in a first horizontal direction and each comprising opposing staircase structures having steps comprising edges of the tiers of the preliminary stack structure. At least two filled trenches are formed vertically over and within horizontal boundaries of the at least two of the stadium structures of each of the rows of stadium structures. Each of the at least two filled trenches comprises a dielectric liner material on surfaces of the preliminary stack structure, and dielectric structures on the dielectric liner material and substantially confined within horizontal areas of the steps of the opposing staircase structures of one of the at least two of the stadium structures. The preliminary stack structure is divided into blocks separated from one another by slots. Each of the blocks comprises one of the rows of stadium structures, at least one crest region interposed between the at least two of the stadium structures of the one of the rows of stadium structures in the first horizontal direction, and bridge regions integral and continuous with the at least one crest region and neighboring the at least two of the stadium structures in a second horizontal direction orthogonal to the first horizontal direction. The sacrificial material of the preliminary stack structure is replaced with conductive material by way of the slots.

Figure 6B:
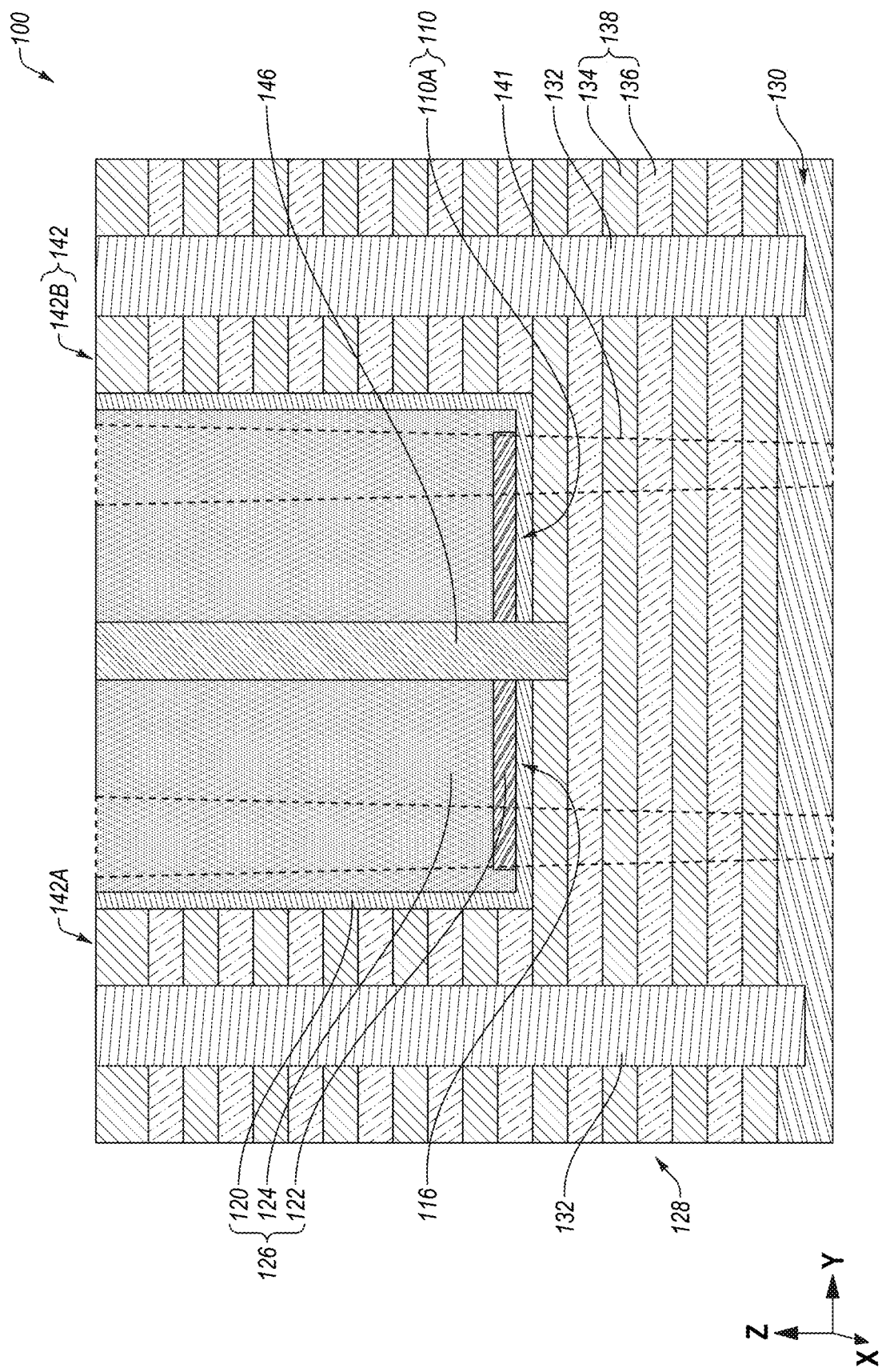
FIG. 6B is a simplified, partial longitudinal cross-sectional view of a portion of the microelectronic device structure at the processing stage of FIG. 6A about the dashed line B-B shown in FIG. 6A.
Figure 7:
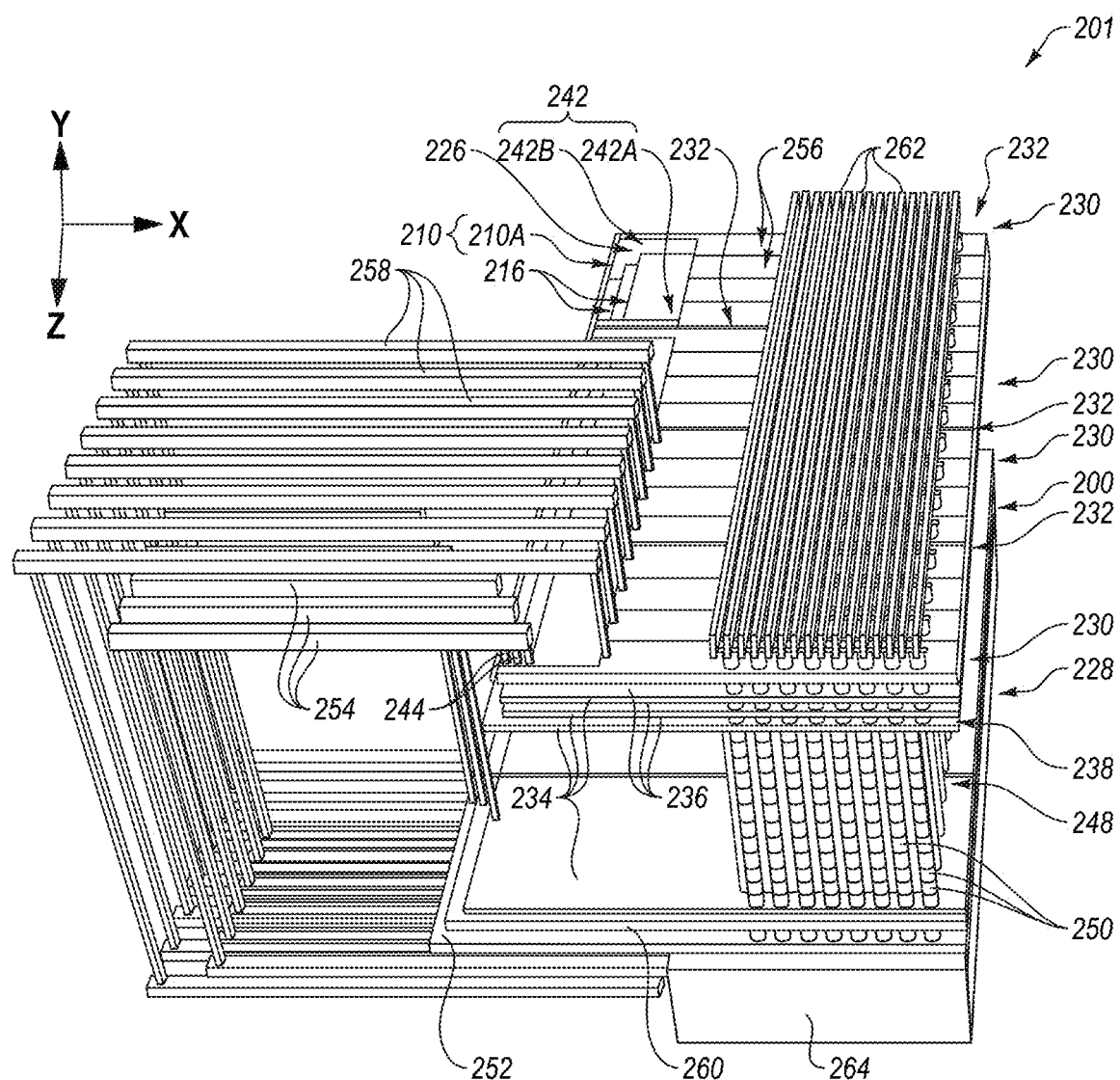
FIG. 7 is a simplified partial cutaway perspective view of a microelectronic device, in accordance with embodiments of the disclosure.

Microelectronic device structures (e.g., the microelectronic device structure 100 previously described with reference to FIGS. 6A and 6B) of the disclosure may be included in microelectronic devices of the disclosure. For example, FIG. 7 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to of the microelectronic device structure 100 previously described with reference to FIGS. 6A and 6B. In FIG. 7 and the associated description, functionally similar features (e.g., structures, materials) are referred to with similar reference numerals incremented by 100. To avoid repetition, not all features shown in FIG. 7 are described in detail herein. Rather, unless described otherwise below, a feature designated by a reference numeral that is a 100 increment of the reference numeral of a previously described feature will be understood to be substantially similar to the previously described feature. By way of non-limiting example, unless described otherwise below, a feature designated by the reference numeral 226 in FIG. 7 will be understood to be substantially similar to the filled trenches 126 (including the dielectric liner material 120, the dielectric structures 122, and the dielectric fill material 124 thereof) previously described herein with reference to FIGS. 6A and 6B. In addition, for clarity and ease of understanding the drawings and associated description, some features (e.g., structures, materials) of the microelectronic device structure 100 previously described herein are not shown in FIG. 7. However, it will be understood that any features of the microelectronic device structure 100 previously described with reference to one or more of FIGS. 6A and 6B may be included in the microelectronic device structure 200 of the microelectronic device 201 described herein with reference to FIG. 7.

As shown in FIG. 7, in addition to the features of the microelectronic device structure 200 previously described herein in relation to the microelectronic device structure 100 (FIGS. 6A and 6B), the microelectronic device 201 may further include cell pillar structures 248 vertically extending through each block 230 of the stack structure 228. The cell pillar structures 248 may be positioned within regions (e.g., memory array regions) of the block 230 horizontally offset (e.g., in the X-direction) from the stadium structures 210 (e.g., the first stadium structure 210A) (and, hence, the bridge regions 242) within the blocks 230. Intersections of the cell pillar structures 248 and the conductive structures 236 of the tiers 238 of the blocks 230 of stack structure 228 form strings of memory cells 250 vertically extending through each block 230 of the stack structure 202. For each string of memory cells 250, the memory cells 250 thereof may be coupled in series with one another. Within each block 230, the conductive structures 236 of some of the tiers 238 thereof may serve as access line structures (e.g., word line structures) for the strings of memory cells 250 within the horizontal area of the block 230. In some embodiments, within each block 230, the memory cells 250 formed at the intersections of the conductive structures 236 of some of the tiers 238 and the cell pillar structures 248 comprise so-called "MONOS" (metal-oxide-nitride-oxide-semiconductor) memory cells. In additional embodiments, the memory cells 250 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 250 comprise so-called "floating gate" memory cells including floating gates (e.g., metallic floating gates) as charge storage structures. The floating gates may horizontally intervene between central structures of the cell pillar structures 248 and the conductive structures 236 of the different tiers 238 of the stack structure 228.

The microelectronic device 201 may further include at least one source structure 252, access line routing structures 254, first select gates 256 (e.g., upper select gates, drain select gates (SGDs)), select line routing structures 258, one or more second select gates 260 (e.g., lower select gates, source select gate (SGSs)), and digit line structures 262. The digit line structures 262 may vertically overlie and be coupled to the cell pillar structures 248 (and, hence, the strings of memory cells 250). The source structure 252 may vertically underlie and be coupled to the cell pillar structures 248 (and, hence, the strings of memory cells 250). In addition, the contact structures 244 may couple various features of the microelectronic device 201 to one another as shown (e.g., the select line routing structures 258 to the first select gates 256; the access line routing structures 254 to the conductive structures 236 of the tiers 238 of the blocks 230 of the stack structure 228).

The microelectronic device 201 may also include a base structure 264 positioned vertically below the cell pillar structures 248 (and, hence, the strings of memory cells 250). The base structure 264 may include at least one control logic region including control logic devices configured to control various operations of other features (e.g., the strings of memory cells 250) of the microelectronic device 201. As a non-limiting example, the control logic region of the base structure 264 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 264 may be coupled to the source structure 252, the access line routing structures 254, the select line routing structures 258, and the digit line structures 262. In some embodiments, the control logic region of the base structure 264 includes CMOS (complementary metal-oxide-semiconductor) circuitry. In such embodiments, the control logic region of the base structure 264 may be characterized as having a "CMOS under Array" ("CuA") configuration.

Thus, in accordance with embodiments of the disclosure, a memory device comprises a stack structure, filled trenches, and strings of memory cells. The stack structure comprises tiers each comprising a conductive material and an insulative material vertically neighboring the conductive material. The stack structure is divided into blocks extending in parallel in a first direction and separated from one another in a second direction by dielectric slot structures. Each of the blocks comprises a stadium structure, first elevated regions, and second elevated regions. The stadium structure comprises opposing staircase structures individually having steps comprising horizontal ends of at least some the tiers of the stack structure. The first elevated regions neighbor opposing ends of the stadium structure in the first direction. The second elevated regions neighbor opposing sides of the stadium structure in the second direction. Uppermost surfaces of the second elevated regions are substantially coplanar with uppermost surfaces of the first elevated regions. The filled trenches are within the blocks of the stack structure. Each of the filled trenches is vertically over and within a horizontal area of the stadium structure of one of the blocks of the stack structure. Each of the filled trenches comprises a dielectric liner material on surfaces of the stadium structure, the first elevated regions, and the second elevated regions; dielectric structures on the dielectric liner material and substantially confined within horizontal boundaries of the steps of the stadium structure; and a dielectric fill material over the dielectric structures and the dielectric liner material. The strings of memory cells vertically extend through a portion of each of the blocks neighboring the stadium structure in the first direction.

Figure 8:
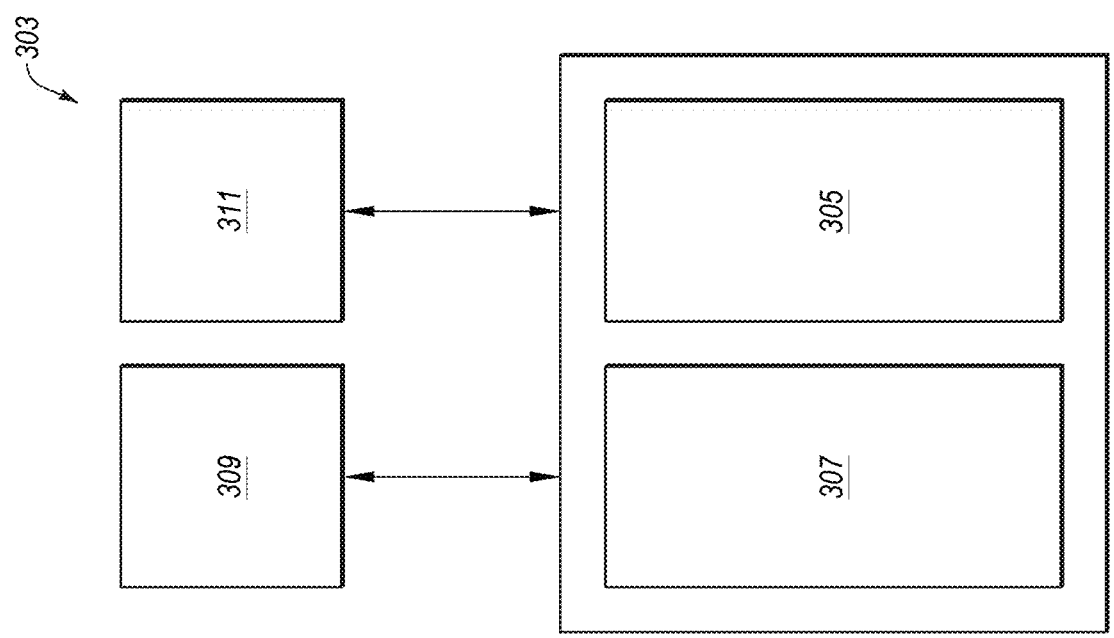
FIG. 8 is a schematic block diagram illustrating an electronic system, in accordance with embodiments of the disclosure.

Microelectronic devices structures (e.g., the microelectronic device structure 100 previously described with reference to FIGS. 6A and 6B) and microelectronic devices (e.g., the microelectronic device 201 (FIG. 7)) in accordance with embodiments of the disclosure may be used in embodiments of electronic systems of the disclosure. For example, FIG. 8 is a block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 303 includes at least one memory device 305. The memory device 305 may comprise, for example, one or more of a microelectronic device structure (e.g., the microelectronic device structure previously described with reference to FIGS. 6A and 6B) and a microelectronic device (e.g., the microelectronic device 201 (FIG. 7)) previously described herein. The electronic system 303 may further include at least one electronic signal processor device 307 (often referred to as a "microprocessor"). The electronic signal processor device 307 may, optionally, include one or more of a microelectronic device structure (e.g., the microelectronic device structure 100 previously described with reference to FIGS. 6A and 6B) and a microelectronic device (e.g., the microelectronic device 201 (FIG. 7)) previously described herein. While the memory device 305 and the electronic signal processor device 307 are depicted as two (2) separate devices in FIG. 8, in additional embodiments, a single (e.g., only one) memory/processor device having the functionalities of the memory device 305 and the electronic signal processor device 307 is included in the electronic system 303. In such embodiments, the memory/processor device may include one or more of a microelectronic device structure (e.g., the microelectronic device structure 100 previously described with reference to FIGS. 6A and 6B) and a microelectronic device (e.g., the microelectronic device 201 (FIG. 7)) previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 comprise a single touchscreen device that can be used both to input information to the electronic system 303 and to output visual information to a user. The input device 309 and the output device 311 may communicate electrically with one or more of the memory device 305 and the electronic signal processor device 307.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure, filled trenches, and conductive contact structures. The stack structure having a vertically alternating sequence of conductive material and insulative material arranged in tiers. The stack structure comprises at least two blocks separated from one another by at least one dielectric structure. Each of the at least two blocks comprises two elevated regions, a stadium structure, and two additional elevated regions. The stadium structure is interposed between the two elevated regions in a first horizontal direction and comprises staircase structures opposing one another in the first horizontal direction. The staircase structures each have steps comprising edges of the tiers of the stack structure. The two additional elevated regions neighbor opposing sides of the stadium structure in a second horizontal direction perpendicular to the first horizontal direction. The filled trenches are over and within horizontal boundaries of the at least two blocks of the stack structure. Each of the filled trenches comprises a dielectric liner material, dielectric structures, and a dielectric fill material. The dielectric liner material is on surfaces of the stadium structure, the two elevated regions, and the two additional elevated regions of one of the at least two blocks of the stack structure. The dielectric structures are on horizontally extending surfaces of the dielectric liner material and are omitted from vertically extending surfaces of the dielectric liner material. The dielectric fill material is over the dielectric structures and the dielectric liner material. The conductive contact structures vertically extend completely through the filled trenches.

The structures, devices, system, and methods of the disclosure advantageously facilitate one or more of improved microelectronic device performance, reduced costs (e.g., manufacturing costs, material costs), increased miniaturization of components, and greater packaging density as compared to conventional structures, conventional devices, conventional systems, and conventional methods. The structures, devices, systems, and methods of the disclosure may also improve scalability, efficiency, and simplicity as compared to conventional structures, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A method of forming a microelectronic device, comprising:
    forming a preliminary stack structure comprising a vertically alternating sequence of sacrificial material and insulative material arranged in tiers, the preliminary stack structure further comprising rows of stadium structures each comprising:
        at least two of the rows of stadium structures neighboring one another in a first horizontal direction and each comprising opposing staircase structures having steps comprising edges of the tiers of the preliminary stack structure;
    forming at least two filled trenches vertically over and within horizontal boundaries of the at least two of the rows of stadium structures of each of the rows of stadium structures, each of the at least two filled trenches comprising:
        a dielectric liner material on surfaces of the preliminary stack structure; and
        dielectric structures on the dielectric liner material and substantially confined within horizontal areas of the steps of the opposing staircase structures of one of the at least two of the stadium structures; and
        a dielectric fill material on surfaces of the dielectric structures and the dielectric liner material and having a different material composition than at least the dielectric structures, the dielectric fill material horizontally interposed between portions of the dielectric liner material and the dielectric structures in a second horizontal direction orthogonal to the first horizontal direction;
    dividing the preliminary stack structure into blocks separated from one another by slots, each of the blocks comprising:
        one of the rows of stadium structures;
        at least one crest region interposed between the at least two of the rows of stadium structures of the one of the rows of stadium structures in the first horizontal direction; and bridge regions integral and continuous with the at least one crest region and neighboring the at least two of the stadium structures in the second horizontal direction; and replacing the sacrificial material of the preliminary stack structure with conductive material by way of the slots.

2. The method of claim 1, further comprising forming portions of the dielectric fill material to horizontally intervene between and separate vertically extending surfaces of the dielectric structures and the dielectric liner material.

3. The method of claim 1, further comprising forming conductive contact structures vertically extending through each of the at least two filled trenches and to portions of the conductive material at the steps of the opposing staircase structures of each of the at least two of the stadium structures.

4. The method of claim 3, wherein forming conductive contact structures comprises:
removing portions of a dielectric fill material overlying the dielectric structures to form contact openings vertically extending to the dielectric structures;
extending the contact openings through the dielectric structures and the dielectric liner material and to the portions of the conductive material; and
forming conductive material within the extended contact openings.

5. The method of claim 1, further comprising:
forming the dielectric liner material to comprise silicon dioxide;
forming the dielectric structures to comprise silicon nitride; and
forming the dielectric fill material to comprise additional silicon dioxide.

6. The method of claim 1, further comprising forming the dielectric liner material of each of the at least two filled trenches to horizontally intervene between pairs of the dielectric structures neighboring one another in the first horizontal direction.

7. The method of claim 1, wherein forming at least two filled trenches comprises:
forming an additional dielectric liner material on the dielectric liner material; and
substantially removing portions of the additional dielectric liner material on vertically extending surfaces of the dielectric liner material to form the dielectric structures of each of the at least two filled trenches.

8. The method of claim 1, further comprising forming upper surfaces of the at least one crest region and the bridge regions of each of the blocks to be substantially coplanar with upper surfaces of the at least two filled trenches vertically over the at least two of the stadium structures of each of the rows of stadium structures.

9. A method of forming a microelectronic device, comprising:
forming a preliminary stack structure comprising:
tiers each including sacrificial material and insulative material vertically neighboring the sacrificial material;
a stadium structure comprising opposing staircase structures having steps comprising edges of some of the tiers; and
a trench vertically overlying and within a horizontal area of the stadium structure;
forming insulative liner material on surfaces of the preliminary stack structure defining the trench;
forming insulative structures on the insulative liner material, each of the insulative structures respectively substantially confined within a horizontal area of a tread of one of the steps of the opposing staircase structures of the stadium structure;
forming insulative fill material over the insulative liner material and the insulative structures and having a different material composition than at least the insulative structures, the insulative fill material horizontally interposed between portions of the insulative liner material and the insulative structures in a first direction;
forming two slots vertically extending completely through the preliminary stack structure and horizontally neighboring opposing boundaries of the stadium structure in the first direction, the two slots partially defining horizontally boundaries of a block comprising:
the stadium structure;
two elevated regions, the stadium structure horizontally interposed between the two elevated regions in a second direction orthogonal to the first direction; and
two additional elevated regions extending from and between the two elevated regions in the second direction, the stadium structure horizontally interposed between the two additional elevated regions in the first direction; and
replacing the sacrificial material of the preliminary stack structure with conductive material after forming the two slots.

10. The method of claim 9, further comprising forming conductive contact structures within the horizontal area of the stadium structure after replacing the sacrificial material of the preliminary stack structure with the conductive material, the conductive contact structures respectively vertically extending through the insulative fill material, one of the insulative structures, and the insulative liner material and contacting the conductive material at a vertical position of one of the tiers.

11. The method of claim 10, wherein forming conductive contact structures comprises forming each of the conductive contact structures to horizontally overlap, in the first direction and the second direction, a horizontal center of the one of the insulative structures associated therewith.

12. The method of claim 9, further comprising forming support pillars within the horizontal area of the stadium structure before replacing the sacrificial material of the preliminary stack structure with the conductive material, the support pillars vertically extending completely through a portion of the preliminary stack structure within the horizontal area of the stadium structure.

13. The method of claim 9, wherein forming insulative structures on the insulative liner material comprises forming the insulative structures to have a material composition different than a material composition of the insulative liner material and substantially the same as a material composition of the sacrificial material of the tiers of the preliminary stack structure.

14. The method of claim 9, wherein forming insulative structures on the insulative liner material comprises:
forming an additional insulative liner material on horizontally extending surfaces and vertically extending surfaces of the insulative liner material within the horizontal area of the stadium structure; and
substantially removing portions of the additional insulative liner material on the vertically extending surfaces of the insulative liner material while additional portions of the additional insulative liner material on the horizontally extending surfaces of the insulative liner material.

15. A method of forming a microelectronic device, comprising:
forming a preliminary stack structure comprising:
tiers each including nitride material and oxide material vertically adjacent the nitride material; and
at least two stadium structures horizontally overlapping one another in a first direction and horizontally offset from one another in a second direction orthogonal to the first direction, the at least two stadium structures respectively comprising at least one staircase structure including steps comprising edges of some of the tiers;
forming oxide liner material on surfaces of the preliminary stack structure defining the at least two stadium structures;
forming nitride pad structures on the oxide liner material, the nitride pad structures separated from one another in the second direction and substantially confined within horizontal areas of the steps of the at least two stadium structures, each of the nitride pad structures respectively:
horizontally offset in the first direction from each of two opposing horizontal boundaries of one of the steps most horizontally proximate thereto in the second direction; and
horizontally offset in the second direction from each of two additional opposing horizontal boundaries of the one of the steps;
forming slots vertically extending completely through the preliminary stack structure, the at least two stadium structures interposed between a pair of the slots in the first direction, the pair of the slots defining opposing horizontal ends of a block comprising:
the at least two stadium structures;
at least one crest region interposed between the at least two stadium structures in the second direction; and
bridge regions continuous with the at least one crest region, each of the bridge regions respectively interposed in the first direction between one stadium structure of the at least two stadium structures and one slot of the pair of the slots;
replacing the nitride material of each of the tiers of the preliminary stack structure with conductive material after forming the slots; and
forming contact structures within horizontal areas of the nitride pad structures after replacing the nitride material, each of the contact structures respectively physically contacting and vertically extending completely through one of the nitride pad structures.

16. The method of claim 15, wherein:
forming a preliminary stack structure comprises:
forming the nitride material of each of the tiers to comprise silicon nitride; and
forming the oxide material of each of the tiers to comprise silicon oxide;
forming oxide liner material comprises forming the oxide liner material to comprise additional silicon oxide; and
forming nitride pad structures comprises forming each of the nitride pad structures to comprise additional silicon nitride.

17. The method of claim 15, further comprising forming an uppermost boundary of the at least one crest region of the block to be substantially coplanar with uppermost boundaries of the bridge regions of the block.

* * * * *

UNITED STATES PATENT AND TRADEMARK OFFICE
CERTIFICATE OF CORRECTION

| | |
|---|---|
| PATENT NO. | : 12,127,401 B2 |
| APPLICATION NO. | : 18/321659 |
| DATED | : October 22, 2024 |
| INVENTOR(S) | : Christopher J. Larsen and Lifang Xu |

It is certified that error appears in the above-identified patent and that said Letters Patent is hereby corrected as shown below:

In the Specification

| | | |
|---|---|---|
| Column 4, | Lines 35-36, | change "(e.g. horizontally" to --(e.g., horizontally-- |
| Column 7, | Lines 35-36, | change "more of $SiO_x$ phosphosilicate glass," to --more of $SiO_x$, phosphosilicate glass,-- |

Signed and Sealed this
Seventh Day of January, 2025

Derrick Brent
*Acting Director of the United States Patent and Trademark Office*